US008223289B2

(12) United States Patent
Yamazaki et al.

(10) Patent No.: US 8,223,289 B2
(45) Date of Patent: Jul. 17, 2012

(54) ELECTRO-OPTICAL DEVICE AND METHOD FOR MANUFACTURING THE SAME

(75) Inventors: Shunpei Yamazaki, Setagaya (JP); Yasuhiko Takemura, Atsugi (JP)

(73) Assignee: Semiconductor Energy Laboratory, Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/889,761

(22) Filed: Sep. 24, 2010

(65) Prior Publication Data

US 2011/0012122 A1     Jan. 20, 2011

Related U.S. Application Data

(60) Continuation of application No. 12/498,520, filed on Jul. 7, 2009, now Pat. No. 7,812,894, and a division of application No. 11/491,249, filed on Jul. 24, 2006, now Pat. No. 7,564,512, and a division of application No. 08/818,884, filed on Mar. 17, 1997, now Pat. No. 7,081,938, and a continuation of application No. 08/350,168, filed on Nov. 30, 1994, now abandoned.

(30) Foreign Application Priority Data

Dec. 3, 1993   (JP) ..................... 05-339588

(51) Int. Cl.
*G02F 1/1368*     (2006.01)
*G02F 1/1345*     (2006.01)
*H01L 27/12*     (2006.01)
(52) U.S. Cl. ............... 349/46; 349/47; 349/151; 257/72
(58) Field of Classification Search .............. 349/42, 349/43, 46, 47, 138, 139, 149, 151, 152; 257/59, 72; 345/92
See application file for complete search history.

(56) References Cited

U.S. PATENT DOCUMENTS 2,819,191 A    1/1958   Fuller
(Continued)

FOREIGN PATENT DOCUMENTS

EP     0 161 555     11/1985
(Continued)

OTHER PUBLICATIONS

M.K. Hatalis et al., *High-Performance Thin-Film Transistors in Low-Temperature Crystallized LPCVD Amorphous Silicon Films*, IEEE Electron Device Letters. vol. 1, EDL8, No. 8, Aug. 1987, pp. 361-364.

(Continued)

*Primary Examiner* — Dung T. Nguyen
*Assistant Examiner* — Tai Duong
(74) *Attorney, Agent, or Firm* — Eric J. Robinson; Robinson Intellectual Property Law Office, P.C.

(57) ABSTRACT

Using thin film transistors (TFTs), an active matrix circuit, a driver circuit for driving the active matrix circuit or the like are formed on one substrate. Circuits such as a central processing unit (CPU) and a memory, necessary to drive an electric device, are formed using single crystalline semiconductor integrated circuit chips. After the semiconductor integrated circuit chips are adhered to the substrate, the chips are connected with wirings formed on the substrate by a chip on glass (COG) method, a wire bonding method or the like, to manufacture the electric device having a liquid crystal display (LCD) on one substrate.

34 Claims, 9 Drawing Sheets

U.S. PATENT DOCUMENTS

| | | |
|---|---|---|
| 3,820,108 A | 6/1974 | Luce |
| 4,068,020 A | 1/1978 | Reuschel |
| 4,103,297 A | 7/1978 | McGreivy et al. |
| 4,127,321 A | 11/1978 | Koyama et al. |
| 4,239,346 A | 12/1980 | Lloyd |
| 4,295,711 A | 10/1981 | Tanaka et al. |
| 4,363,828 A | 12/1982 | Brodsky et al. |
| 4,365,013 A | 12/1982 | Ishioka et al. |
| 4,378,417 A | 3/1983 | Maruyama et al. |
| 4,395,726 A | 7/1983 | Maeguchi |
| 4,409,724 A | 10/1983 | Tasch, Jr. et al. |
| 4,438,654 A | 3/1984 | Torstensson |
| 4,460,670 A | 7/1984 | Ogawa et al. |
| 4,470,060 A | 9/1984 | Yamazaki |
| 4,500,388 A | 2/1985 | Ohmura et al. |
| 4,565,584 A | 1/1986 | Tamura et al. |
| 4,581,476 A | 4/1986 | Yamazaki |
| 4,581,620 A | 4/1986 | Yamazaki et al. |
| 4,584,025 A | 4/1986 | Takaoka et al. |
| 4,586,789 A | 5/1986 | Kishimoto et al. |
| 4,591,892 A | 5/1986 | Yamazaki |
| 4,597,160 A | 7/1986 | Ipri |
| 4,609,930 A | 9/1986 | Yamazaki |
| 4,621,276 A | 11/1986 | Malhi |
| 4,651,408 A | 3/1987 | MacElwee et al. |
| 4,659,392 A | 4/1987 | Vasudev |
| 4,680,580 A | 7/1987 | Kawahara |
| 4,690,717 A | 9/1987 | Yamazaki |
| 4,693,759 A | 9/1987 | Noguchi et al. |
| 4,693,770 A | 9/1987 | Hatada |
| 4,697,887 A | 10/1987 | Okada et al. |
| 4,729,009 A | 3/1988 | Ang |
| 4,740,829 A | 4/1988 | Nakagiri et al. |
| 4,743,567 A | 5/1988 | Pandya et al. |
| 4,748,485 A | 5/1988 | Vasudev |
| 4,755,865 A | 7/1988 | Wilson et al. |
| 4,760,008 A | 7/1988 | Yamazaki et al. |
| 4,766,477 A | 8/1988 | Nakagawa et al. |
| 4,772,927 A | 9/1988 | Saito |
| 4,795,679 A | 1/1989 | Ramesh et al. |
| 4,814,842 A | 3/1989 | Nakagawa et al. |
| 4,818,077 A | 4/1989 | Ohwada et al. |
| 4,838,654 A | 6/1989 | Hamaguchi et al. |
| 4,849,797 A | 7/1989 | Ukai et al. |
| 4,860,069 A | 8/1989 | Yamazaki |
| 4,862,237 A | 8/1989 | Morozumi |
| 4,864,376 A | 9/1989 | Aoki et al. |
| 4,885,052 A | 12/1989 | Fan et al. |
| 4,888,305 A | 12/1989 | Yamazaki et al. |
| 4,891,330 A | 1/1990 | Guha et al. |
| 4,897,360 A | 1/1990 | Guckel et al. |
| 4,905,073 A | 2/1990 | Chen et al. |
| 4,906,071 A | 3/1990 | Takahara et al. |
| 4,938,565 A | 7/1990 | Ichikawa |
| 4,949,141 A | 8/1990 | Busta |
| 4,951,113 A | 8/1990 | Huang et al. |
| 4,959,700 A | 9/1990 | Yamazaki |
| 4,969,025 A | 11/1990 | Yamamoto et al. |
| 4,969,031 A | 11/1990 | Kobayashi et al. |
| 4,984,033 A | 1/1991 | Ishizu et al. |
| 4,985,663 A | 1/1991 | Nakatani |
| 4,986,213 A | 1/1991 | Yamazaki et al. |
| 4,988,638 A | 1/1991 | Huang et al. |
| 5,003,356 A | 3/1991 | Wakai et al. |
| 5,012,228 A | 4/1991 | Masuda et al. |
| 5,016,986 A | 5/1991 | Kawashima et al. |
| 5,037,766 A | 8/1991 | Wang |
| 5,043,772 A | 8/1991 | Yamazaki |
| 5,051,570 A | 9/1991 | Tsujikawa et al. |
| 5,055,899 A | 10/1991 | Wakai et al. |
| 5,056,895 A | 10/1991 | Kahn |
| 5,057,889 A | 10/1991 | Yamada et al. |
| 5,057,898 A | 10/1991 | Adan et al. |
| 5,063,378 A | 11/1991 | Roach |
| 5,065,208 A | 11/1991 | Shah et al. |
| 5,077,223 A | 12/1991 | Yamazaki |
| 5,082,351 A | 1/1992 | Fergason |
| 5,084,905 A | 1/1992 | Sasaki et al. |
| 5,089,750 A | 2/1992 | Hatada et al. |
| 5,121,236 A | 6/1992 | Ukai et al. |
| 5,132,754 A | 7/1992 | Serikawa et al. |
| 5,132,820 A | 7/1992 | Someya et al. |
| 5,132,821 A | 7/1992 | Nicholas |
| 5,148,301 A | 9/1992 | Sawatsubashi et al. |
| 5,151,689 A | 9/1992 | Kabuto et al. |
| 5,179,460 A | 1/1993 | Hinata et al. |
| 5,200,847 A | 4/1993 | Mawatari et al. |
| 5,223,961 A | 6/1993 | Ukai et al. |
| 5,233,211 A | 8/1993 | Hayashi et al. |
| 5,236,544 A | 8/1993 | Yamagata |
| 5,247,191 A | 9/1993 | Yamazaki et al. |
| 5,250,818 A | 10/1993 | Saraswat et al. |
| 5,250,931 A | 10/1993 | Misawa et al. |
| 5,261,153 A | 11/1993 | Lucas |
| 5,261,156 A | 11/1993 | Mase |
| 5,270,224 A | 12/1993 | Furumura et al. |
| 5,270,567 A | 12/1993 | Mori et al. |
| 5,270,848 A | 12/1993 | Takabayashi et al. |
| 5,274,279 A | 12/1993 | Misawa et al. |
| 5,281,840 A | 1/1994 | Sarma |
| 5,287,205 A | 2/1994 | Yamazaki et al. |
| 5,289,016 A * | 2/1994 | Noguchi ........................ 257/57 |
| 5,289,030 A | 2/1994 | Yamazaki et al. |
| 5,290,197 A | 3/1994 | Ohnuma et al. |
| 5,308,998 A | 5/1994 | Yamazaki et al. |
| 5,313,076 A | 5/1994 | Yamazaki et al. |
| 5,315,132 A | 5/1994 | Yamazaki |
| 5,323,042 A | 6/1994 | Matsumoto |
| 5,327,001 A | 7/1994 | Wakai et al. |
| 5,341,012 A | 8/1994 | Misawa et al. |
| 5,347,146 A * | 9/1994 | Soh ............................... 257/59 |
| 5,349,204 A | 9/1994 | Yamazaki |
| 5,349,226 A | 9/1994 | Kawaguchi |
| 5,349,366 A | 9/1994 | Yamazaki et al. |
| 5,359,345 A | 10/1994 | Hunter |
| 5,371,398 A | 12/1994 | Nishihara |
| 5,372,958 A | 12/1994 | Miyasaka et al. |
| 5,383,041 A | 1/1995 | Yamazaki et al. |
| 5,402,041 A | 3/1995 | Kishino |
| 5,404,175 A | 4/1995 | Nagae |
| 5,412,240 A | 5/1995 | Inoue et al. |
| 5,416,341 A | 5/1995 | Hayama |
| 5,418,636 A | 5/1995 | Kawasaki |
| 5,424,752 A | 6/1995 | Yamazaki |
| 5,426,526 A | 6/1995 | Yamamoto |
| 5,453,858 A | 9/1995 | Yamazaki |
| 5,481,121 A | 1/1996 | Zhang et al. |
| 5,500,538 A | 3/1996 | Yamazaki et al. |
| 5,500,787 A | 3/1996 | Yoshida |
| 5,514,879 A | 5/1996 | Yamazaki |
| 5,528,403 A | 6/1996 | Kawaguchi et al. |
| 5,530,266 A | 6/1996 | Yonehara et al. |
| 5,539,550 A | 7/1996 | Spitzer et al. |
| 5,568,288 A | 10/1996 | Yamazaki et al. |
| 5,581,092 A | 12/1996 | Takemura |
| 5,583,347 A | 12/1996 | Misawa et al. |
| 5,591,990 A | 1/1997 | Misawa et al. |
| 5,606,440 A | 2/1997 | Kawaguchi et al. |
| 5,612,799 A | 3/1997 | Yamazaki et al. |
| 5,614,732 A | 3/1997 | Yamazaki |
| 5,616,936 A | 4/1997 | Misawa et al. |
| 5,616,944 A | 4/1997 | Mizutani et al. |
| 5,620,905 A | 4/1997 | Konuma et al. |
| 5,644,147 A | 7/1997 | Yamazaki et al. |
| 5,648,277 A | 7/1997 | Zhang et al. |
| 5,648,685 A | 7/1997 | Misawa et al. |
| 5,654,811 A | 8/1997 | Spitzer et al. |
| 5,656,826 A | 8/1997 | Misawa et al. |
| 5,677,212 A | 10/1997 | Misawa et al. |
| 5,680,192 A | 10/1997 | Burrell et al. |
| 5,701,167 A | 12/1997 | Yamazaki |
| 5,702,963 A * | 12/1997 | Vu et al. ..................... 438/197 |
| 5,712,493 A | 1/1998 | Mori et al. |
| 5,712,495 A | 1/1998 | Suzawa |
| 5,714,771 A | 2/1998 | Misawa et al. |
| 5,742,074 A | 4/1998 | Takizawa et al. |
| 5,744,818 A | 4/1998 | Yamazaki et al. |

| | | | | | | |
|---|---|---|---|---|---|---|
| 5,744,824 | A | 4/1998 | Kousai et al. | JP | 63-096636 | 4/1988 |
| 5,754,158 | A | 5/1998 | Misawa et al. | JP | 63-100777 | 5/1988 |
| 5,757,456 | A | 5/1998 | Yamazaki et al. | JP | 63-208896 | 8/1988 |
| 5,766,977 | A | 6/1998 | Yamazaki | JP | 63-219172 | 9/1988 |
| 5,780,872 | A | 7/1998 | Misawa et al. | JP | 63-237570 | 10/1988 |
| 5,781,164 | A | 7/1998 | Jacobsen et al. | JP | 63-237570 A | 10/1988 |
| 5,790,220 | A | 8/1998 | Sakamoto et al. | JP | 63-237571 | 10/1988 |
| 5,807,772 | A | 9/1998 | Takemura | JP | 63-237571 A | 10/1988 |
| 5,808,595 | A | 9/1998 | Kubota et al. | JP | 01-030272 | 2/1989 |
| 5,811,837 | A | 9/1998 | Misawa et al. | JP | 64-059866 | 3/1989 |
| 5,818,070 | A | 10/1998 | Yamazaki et al. | JP | 64-059866 A | 3/1989 |
| 5,822,030 | A | 10/1998 | Uchiyama | JP | 64-068724 | 3/1989 |
| 5,825,439 | A | 10/1998 | Noriyama | JP | 64-068728 | 3/1989 |
| 5,834,327 | A | 11/1998 | Yamazaki et al. | JP | 01-094670 | 4/1989 |
| 5,835,177 | A | 11/1998 | Dohjo et al. | JP | 01-107237 | 4/1989 |
| 5,846,320 | A | 12/1998 | Matsuyama et al. | JP | 01-128534 | 5/1989 |
| 5,849,601 | A | 12/1998 | Yamazaki | JP | 01-130131 | 5/1989 |
| 5,851,440 | A | 12/1998 | Tanaka et al. | JP | 01-152426 | 6/1989 |
| 5,889,291 | A | 3/1999 | Koyama et al. | JP | 01-156725 | 6/1989 |
| 5,904,511 | A | 5/1999 | Misawa et al. | JP | 01-223719 | 9/1989 |
| 5,917,221 | A | 6/1999 | Takemura | JP | 01-268064 | 10/1989 |
| 5,933,205 | A | 8/1999 | Yamazaki et al. | JP | 01-268064 A | 10/1989 |
| 5,963,278 | A | 10/1999 | Yamazaki et al. | JP | 01-281431 | 11/1989 |
| 6,118,502 | A | 9/2000 | Yamazaki et al. | JP | 01-289917 | 11/1989 |
| 6,165,824 | A | 12/2000 | Takano et al. | JP | 02-051129 | 2/1990 |
| 6,198,133 | B1 | 3/2001 | Yamazaki et al. | JP | 02-062077 | 3/1990 |
| 6,404,476 | B1 | 6/2002 | Mase | JP | 02-090531 | 3/1990 |
| 6,590,230 | B1 | 7/2003 | Yamazaki et al. | JP | 02-103925 | 4/1990 |
| 7,050,138 | B1 | 5/2006 | Yamazaki et al. | JP | 02-115824 | 4/1990 |
| 7,446,843 | B2 | 11/2008 | Yamazaki et al. | JP | 02-137822 | 5/1990 |
| 2003/0071953 | A1 | 4/2003 | Yamazaki et al. | JP | 02-174170 | 7/1990 |
| 2005/0070038 | A1 | 3/2005 | Yamazaki et al. | JP | 02-188723 | 7/1990 |
| 2007/0115416 | A1 | 5/2007 | Yamazaki et al. | JP | 02-201967 | 8/1990 |
| 2009/0185130 | A1 | 7/2009 | Yamazaki et al. | JP | 02-207537 | 8/1990 |

FOREIGN PATENT DOCUMENTS

| | | | |
|---|---|---|---|
| JP | 02-208635 | 8/1990 | |
| EP | 0 321 073 | 6/1989 | |
| EP | 0 337 457 | 10/1989 | |
| JP | 02-208636 | 8/1990 | |
| JP | 49-077537 | 7/1974 | |
| JP | 02-208943 | 8/1990 | |
| JP | 53-144297 | 12/1978 | |
| JP | 02-210330 | 8/1990 | |
| JP | 55-011329 | 1/1980 | |
| JP | 02-210330 A | 8/1990 | |
| JP | 55-029154 | 3/1980 | |
| JP | 02-217826 | 8/1990 | |
| JP | 55-032026 | 3/1980 | |
| JP | 02-223912 | 9/1990 | |
| JP | 55-050663 | 4/1980 | |
| JP | 02-223912 A | 9/1990 | |
| JP | 55-050664 | 4/1980 | |
| JP | 02-234134 | 9/1990 | |
| JP | 55-082458 | 6/1980 | |
| JP | 02-251992 | 10/1990 | |
| JP | 57-099729 | 6/1982 | |
| JP | 03-090924 | 4/1991 | |
| JP | 58-027364 | 2/1983 | |
| JP | 03-221922 | 9/1991 | |
| JP | 58-027364 A | 2/1983 | |
| JP | 03-246973 | 11/1991 | |
| JP | 58-027365 | 2/1983 | |
| JP | 03-290924 | 12/1991 | |
| JP | 58-074080 | 5/1983 | |
| JP | 04-042214 | 2/1992 | |
| JP | 58-092217 | 6/1983 | |
| JP | 04-186635 | 7/1992 | |
| JP | 58-155773 | 9/1983 | |
| JP | 04-242724 | 8/1992 | |
| JP | 58-155774 | 9/1983 | |
| JP | 04-245655 | 9/1992 | |
| JP | 58-161380 | 9/1983 | |
| JP | 04-350627 | 12/1992 | |
| JP | 58-182816 | 10/1983 | |
| JP | 04-369271 | 12/1992 | |
| JP | 59-005229 | 1/1984 | |
| JP | 05-014911 A | 1/1993 | |
| JP | 59-035423 | 2/1984 | |
| JP | 05-053147 | 3/1993 | |
| JP | 59-035488 | 2/1984 | |
| JP | 05-102483 | 4/1993 | |
| JP | 59-072128 | 4/1984 | |
| JP | 05-114724 | 5/1993 | |
| JP | 59-072182 | 4/1984 | |
| JP | 05-134272 | 5/1993 | |
| JP | 59-115574 | 7/1984 | |
| JP | 05-142577 | 6/1993 | |
| JP | 60-021083 | 2/1985 | |
| JP | 0 553 775 | 8/1993 | |
| JP | 60-088971 | 5/1985 | |
| JP | 0 554 063 | 8/1993 | |
| JP | 60-245172 | 12/1985 | |
| JP | 05-235351 | 9/1993 | |
| JP | 60-245173 | 12/1985 | |
| JP | 05-249495 | 9/1993 | |
| JP | 60-245174 | 12/1985 | |
| JP | 05-249498 | 9/1993 | |
| JP | 61-004021 | 1/1986 | |
| JP | 05-264987 | 10/1993 | |
| JP | 61-126595 | 6/1986 | |
| JP | 05-265022 | 10/1993 | |
| JP | 61-136262 | 6/1986 | |
| JP | 05-267667 | 10/1993 | |
| JP | 61-141174 | 6/1986 | |
| JP | 05-283694 | 10/1993 | |
| JP | 61-220371 | 9/1986 | |
| JP | 06-082818 | 3/1994 | |
| JP | 61-220371 A | 9/1986 | |
| JP | 06-088971 | 3/1994 | |
| JP | 62-115745 | 5/1987 | |
| JP | 06-202156 | 7/1994 | |
| JP | 62-126677 | 6/1987 | |
| JP | 06-244103 | 9/1994 | |
| JP | 62-147759 | 7/1987 | |
| JP | 06-244104 | 9/1994 | |
| JP | 62-160425 | 7/1987 | |
| JP | 06-250212 | 9/1994 | |
| JP | 62-160425 A | 7/1987 | |
| JP | 06-250214 | 9/1994 | |
| JP | 63-029729 | 2/1988 | |
| JP | 06-250214 A | 9/1994 | |
| JP | | | |
| JP | 06-275830 | 9/1994 | |
| JP | 06-296021 | 10/1994 | |

| | | |
|---|---|---|
| JP | 07-014880 | 1/1995 |
| JP | 07-135318 | 5/1995 |
| JP | 07-044369 | 11/1995 |
| JP | 08-015715 | 1/1996 |
| JP | 08-078329 | 3/1996 |
| JP | 08-250745 | 9/1996 |
| JP | 08-254686 | 10/1996 |
| JP | 10-135468 | 5/1998 |
| JP | 10-247735 | 9/1998 |
| KR | 90-17171 | 11/1990 |
| KR | 92-18644 | 10/1992 |

OTHER PUBLICATIONS

Shusuke Kobayashi, "Color Liquid Crystal Display," Dec. 14, 1990, pp. 162-166.

M. Akiyama, et al., "An Active-Matrix LCD with Integrated Driver Circuits Using a-Si TFTs," Japan Display, Sep. 30, 1986, pp. 212-215.

"The Physics of Hydrogenated Amorphous Silicon I Structure, Preparation, and Devices@," Edited by J.D. Joannapoulos and G. Luchvsky, Springer-Verlag, Berlin Heidelberg, New York, Tokyo 1984, pp. 8-9 & 38-41.

Lewis et al., "Active Matrix Liquid Crystal Display Design Using Low and High Temperature Processed Polysilicon TFTs," CH2865-4/90/0000-0843, IEDM90, Dec. 9, 1990, pp. 843-846.

Tsai et al., "Amorphous Si Prepared in a UHV Plasma Deposition System," Journal of Non-Crystalline Solids, vol. 59 & 60, Dec. 1983, Part II, pp. 731-734.

Alan G. Lewis et al., Conference Record of the 1994 IDRC (International Display Research Conference), "Driver Circuits for AMLCDs," Oct. 10, 1994, pp. 56-63.

S. M. Sze, VLSI Technology, Second Edition: "Chapter 6 Dielectric and Polysilicon Film Deposition," A. C. Adams, McGraw-Hill Book Company, pp. 233-235, 1981.

Wolf et al., Polycrystalline Silicon: Properties and CVD Deposition Methods "Silicon Processing for the VLSI Era, vol. 1: Process Technology," Lattice Press, Sunset Beach, CA, (1986), pp. 175-176.

Charles MaGee et al., "Solar Cells 2: Investigation of the Hydrogen and Impurity Contents of Amorphous Silicon by Secondary Ion Mass Spectrometry," RCA Laboratories, Princeton, NJ, 1980, vol. 2, No. 4, pp. 365-376.

Scheid et al., "Super Large Grain Polycrystalline Silicon Obtained From Pyrolysis of $Si_2H_6$ and Annealing," Japanese J. Appl. Phys., vol. 29, No. 11, Nov. 1990, pp. L 2105-2107.

Blum et al., "Low Pressure CVC Process for Micro and Polycrystalline Silicon," IBM Technical Disclosure Bulletin, vol., 26, No. 3A, Aug. 1983, pp. 921-922.

Madsen et al., "In Situ Doping of Silicon Films Prepared by Low Pressure Chemical Vapor Deposition Using Disilane and Phosphine," J. Electrochem Soc., Col. 137, No. 7, Jul. 1990, pp. 2246-2251.

H. Ohshima et al., "Future Trends for TFT Integrated Circuits on Glass Substrates," IEDM, (IEEE 1989), pp. 157-160.

Masakiyo Matsumura, "(Invited) Amorphous Silicon Transistors and Integrated Circuits," Japanese J. App. Phys., vol. 22, (1983), Supplement 22-1, pp. 487-491.

M. Sze, VLSI Technology, Second Edition: "Chapter 6 Dielectric and Polysilicon Film Deposition," A. C. Adams, McGraw-Hill Book Company, pp, 233-235, 1988.

* cited by examiner

ELECTRO-OPTICAL DEVICE AND METHOD FOR MANUFACTURING THE SAME

BACKGROUND OF THE INVENTION

1. Field of the Invention

The present invention relates to an electric device having a non-light emitting type display such as a liquid crystal display, which an active matrix circuit is formed on a substrate by using thin film transistors (TFTs). In particular, the active matrix circuit of the electric device according to the present invention is drive-controlled by a driving circuit constructed by TFTs formed on the same substrate.

2. Description of the Related Art

Recently, a liquid crystal display is used as a display in an various electric devices of a portable type (for example, a personal computer, a word processor, or an electric pocket note book), by utilizing that the liquid crystal display is thin and light in weight. In particular, since an active matrix type liquid crystal display which controls each pixel one by one using TFTs has superior display characteristic, it is used in many electric devices.

There are various types of an active matrix type liquid crystal displays. One display (first type) has an active matrix circuit formed by using TFTs and its driving circuit constructed by a single crystalline semiconductor integrated circuit chip of an external type. Since it is necessary to connect semiconductor chips and semiconductor packages with a portion around a glass substrate in such unit by using TAB (Tape Automated Bonding) or the like, a display gets relatively large. Also, since a width of wirings (interconnection) extending from the active matrix circuit get small to improve an opening (aperture) rate and the total number of wirings exceeds 1000, there is a technical problem in wiring connection. Further, a large area is required in a connection portion. Furthermore, since thermal expansion coefficients between wirings in a glass substrate and wirings in an external chip and thermal expansion coefficients between the wiring in the glass substrate and a tape in a TAB are different from each other, alignment precision is about 60 µm. Therefore, it cannot be applied to a high resolution display which has a pixel pitch of 60 µm or shorter and miniaturization of a display cannot be performed, so that a TFT using an amorphous silicon which can be formed at a low temperature is used in such display.

Another display (second type) has a thin film integrated circuit having an active matrix circuit and driving circuits such as an X-decoder/driver and a Y-decoder/driver which are formed on the same substrate using TFTs. Since an external type semiconductor chip as described above is not used in such display device, a display gets relatively small. Also, since it is not necessary to connect with many wirings, it is superior in miniaturization of a display. In such display, it is necessary to use TFTs constructed by a crystalline silicon having a superior characteristic in a driving circuit.

As a result, the second type display is superior to the first type display in miniaturization of a display. In the second type display, however, further miniaturization, light weighting and thinning are not performed insufficiently. That is, in a personal computer, various semiconductor chips such as a central processing unit (CPU), a main memory, an image signal processing unit, an image memory and the like are formed in a main substrate (main board) other than a liquid crystal display board, and therefore it is necessary to use at least two substrates or boards (main board and liquid crystal display board). To further miniaturization, light weighting and thinning of a display, it is desired to use only one board in stead of two boards.

SUMMARY OF THE INVENTION

The present invention is to perform miniaturization, light weighting and thinning of a display, by arranging semiconductor chips as provided in the above main board in at least one substrate in the a liquid crystal display which a liquid crystal material is held between a pair of substrates. In particular, these chip are provided in a substrate (board) in which an active matrix circuit is formed. Also, a driving circuit for driving the active matrix circuit is formed by using thin film transistors (TFTs).

According to the present invention, there is provided an electric device comprising: a substrate; an active matrix circuit including at least one thin film transistor; a driving circuit including at least another one thin film transistor for driving the active matrix circuit; and at least one semiconductor integrated circuit chip for controlling the driving circuit, wherein the active matrix circuit, the driving circuit and semiconductor integrated circuit chip are formed on the substrate.

DETAILED DESCRIPTION OF THE PREFERRED EMBODIMENTS

Figure 1:
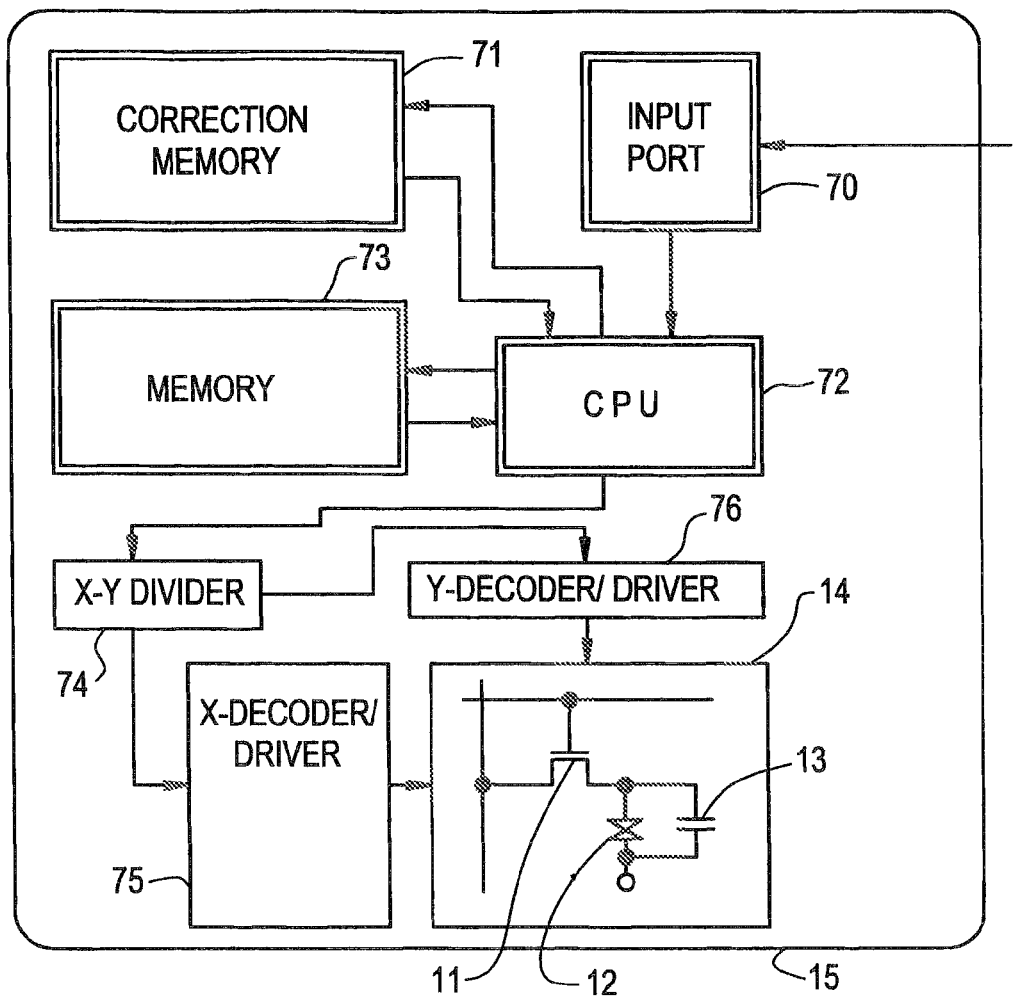
FIG. 1 is a block diagram showing an electro-optical device.

FIG. 1 shows concept of the present invention. In FIG. 1, an active matrix circuit 14 having a plurality of pixels which each includes a TFT 11, a pixel electrode 12 and an auxiliary capacitor 13 and its driving circuit for driving the active matrix circuit 14 are formed by using TFTs on a substrate (board) 15 made of a glass also used as a liquid crystal display substrate. The driving circuit has an X-decoder/driver 75, a Y-decoder/driver 76 and an X-Y divider 74. The driver circuit may include the X-Y divider 74, or the X-Y divider 74 may be included in a chip as described later.

Another chips are further provided on the substrate 15. these chips are connected with circuits on the substrate 15 by a wire bonding, a chip on glass (COG) including a flip chip on glass (FCOG) method or the like. In FIG. 1, a correction memory 71, a memory 73, a CPU (central processing unit) 72 and an input port 70 are used as chips provided by the above method, another chip may be provided.

Figure 2:
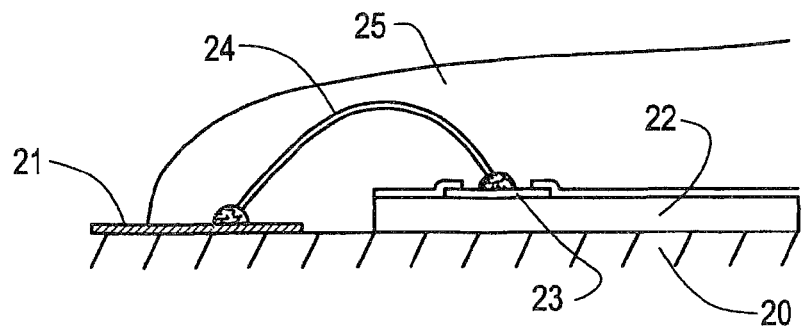
FIG. 2 shows an example of a wire bonding.

When the wire bonding is used, a shape having a cross section as shown in FIG. 2 is obtained. That is, a chip 22 is mounted by an upward formed terminal portion 23 on a glass substrate 20 in which a circuit is manufactured, and a terminal electrode 21 of the circuit is connected with the terminal portion 23 of the chip 22 by a bonding wire 24 made of a metal. This portion is sealed (covered) by a resin 25 to protect a connection portion from an external shock. In order to stably maintain terminal connection/adhesion, it is desired that a surface of the terminal electrode 21 is a metal such as aluminum. In the wire bonding, since the resin 25 rises largely in a terminal connection portion, the resin 25 gets thick.

Figure 4A:
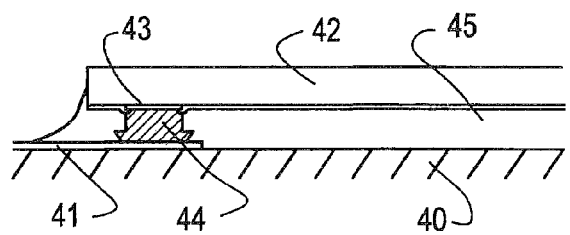
FIGS. 4A and 4B show examples of a FCOG.
Figure 4B:
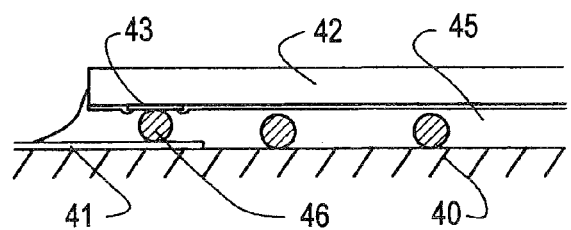

In the FCOG as shown in FIGS. 4A and 4B, a chip 42 is mounted by a downward formed terminal portion 43 on a glass substrate 40 in which a circuit is manufactured, and a terminal electrode 41 of the circuit is connected with the downward formed terminal portion 43 of the chip 42 by a bump 44 (FIG. 4A) or metal particles 46 (FIG. 4B). This portion is sealed by a resin 45 to fix the chip 42 on the substrate 40. As a result, since a thickness of the terminal connection portion substantially corresponds to a thickness of a chip, a thin type display can be manufactured. Also, a material other than aluminum, for example, a transparent conductive oxide film (ITO, Indium tin Oxide or the like) can be used in a terminal on a glass substrate. Commonly, when an active matrix circuit for a liquid crystal display is formed on a glass substrate, since wirings of most upper layer are constructed using the transparent conductive oxide film in many case, the FCOG is superior in this point.

The input port 70 is a circuit for receiving an input signal from an external, for example, a main computer, and converting the received input signal into an image signal. The correction memory 71 is a memory which is inherent in an active matrix panel and is used to correct the input signal or the like in accordance with a characteristic of the active matrix panel. In particular, the correction memory 71 is a non-volatile memory and stores information inherent in each pixel. When a point defect produces in pixels of an electro-optical device, a correction signal is generated with respect to pixels around a pixel which the point defect produces, so that the point defect is compensated. When a pixel is dark in comparison with surround pixels, a signal that the pixel has the same brightness as that of the surround pixels is generated. Since defect information of pixels differs in each of the active matrix panels, information stored in the correction memory 71 differs in each of the active matrix panels. The CPU 72 and the memory 73 are the same functions as these of the commonly used computer, and the memory is a RAM (Random access memory) and stores image information corresponding to each pixel.

Embodiment 1

Figure 3A:
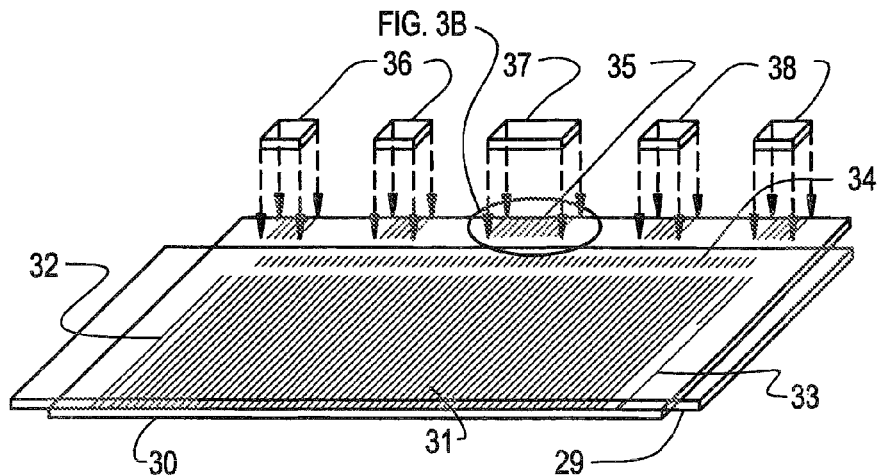
FIGS. 3A-3B show schematic views of a liquid crystal display panel according to Embodiments 1 and 2 of the present invention.
Figure 3B:
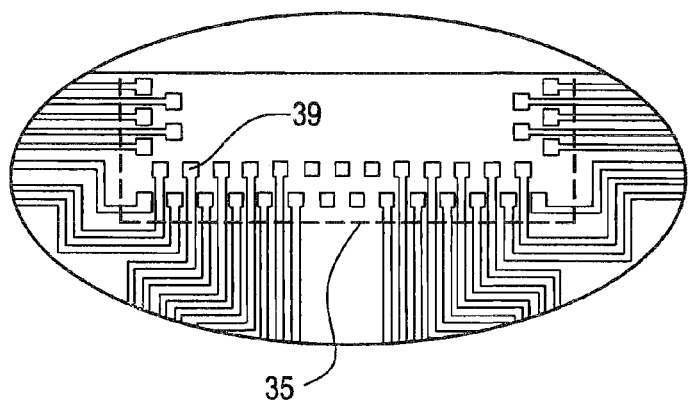

FIGS. 3A-3B show schematic views of a liquid crystal display panel according to an embodiment of the present invention. In FIGS. 3A-3B, a substrate (board) 29 is placed opposite to the substrate (board) 30 and a liquid crystal material is held between the substrates 29 and 30. An active matrix circuit 31 and peripheral driving circuits 32 to 34 for driving the active matrix circuit 31 are formed using thin film transistors (TFTs) on the substrate 30 such as a glass substrate. Also, main memory chips 36, MPU (microprocessing unit) 37 or CPU (central processing unit) and correction memories 38 are adhered to a surface of the substrate 30 in which the above circuits 31 to 34 are formed, and electrically connected with the above circuits 31 to 34. For example, when chips are connected with a substrate by a FCOG, a wiring terminal portion (wiring connection pad) 39 (corresponding to a wiring portion 41 of FIGS. 4A and 4B) made of the ITO are formed in a portion 35 of the substrate 30.

In the embodiment, a connection point having a shape as shown in FIGS. 4A and 4B is used. In FIG. 4A, a conductive projection (bump) 44 formed in an electrode portion 43 of a chip 42 is electrically connected with a wiring portion 41 on a substrate 40, and an organic resin 45 is used to fix the chip 42 on the substrate 40. Gold formed by an electroless plating may be used as the bump 44.

In FIG. 4B, the substrate 40 is adhered to the chip 42 by using an organic resin in which conductive particles (for example, gold particles) 46 are distributed. Therefore, a circuit connection is performed by contacting the wiring portion 41 with the conductive particles 46 distributed between the chip 42 and the electrode portion 43. A light-curable resin, a heat-curable resin, a natural-curable resin or the like is used as the organic resin for adhesive. Injection of a liquid crystal material to a liquid crystal display may be performed after adhering the chip.

After the above processes, a CPU and a memory are formed on a substrate for a liquid crystal display, thereby to construct an electric device such as a personal computer by using one substrate.

Embodiment 2

A panel as shown in FIGS. 3A-3B is manufactured. The active matrix circuit 31 and the peripheral driving circuits 32 to 34 are formed using TFTs on the substrate 30. The main memory chips 36, the MPU (microprocessing unit) 37 or CPU (central processing unit) and the correction memories 38 are adhered to a surface of the substrate 30 in which the above circuits 31 to 34 are formed, and electrically connected with the wiring terminal portion (wiring connection pad) 39 (corresponding to the terminal electrode 21) which is made of an aluminum alloy thin film and formed on the substrate 40 by a wire bonding as shown in FIG. 2. A gold fine line is used as a bonding wire.

Embodiment 3

In this embodiment, chips are adhered to a TFT circuit (monolithic type active matrix circuit) substrate by a FCOG, to construct further improved circuit. A process for manufacturing a monolithic type active matrix circuit will be described later using FIGS. 5A to 5G. A silicon oxide film having a thickness of 1000 to 3000 Å is formed as a base oxide film 502 on a substrate (Corning 7059) 501. A method for forming this oxide film may include a sputtering in an atmosphere containing oxygen or a plasma CVD (Chemical Vapor Deposition).

A silicon film having amorphous or crystalline is formed at a thickness of 300 to 1500 Å, preferably 500 to 1000 Å by a plasma CVD or a low pressure CVD (LPCVD). In order to form an crystalline silicon film, after forming an amorphous silicon film, a laser or an intense light equivalent to the laser may be irradiated (light annealing), or thermal annealing may be performed at 500° C. or higher for a long time of period. Also, after crystallization by the thermal annealing, light annealing may be performed to improve crystallization. In crystallization by the thermal annealing, an element (catalytic element) for promoting crystallization of silicon, such as nickel, may be added.

The silicon film is etched to form TFT active layers 503 and 504 of a peripheral driving circuit and a TFT active layer 504 of an active matrix circuit, as island-like regions. Further, an silicon oxide having a thickness of 500 to 2000 Å is formed as a gate insulating film 506 in an atmosphere containing oxygen by a sputtering. A method for forming the gate insulating film may include a plasma CVD.

Figure 5A:
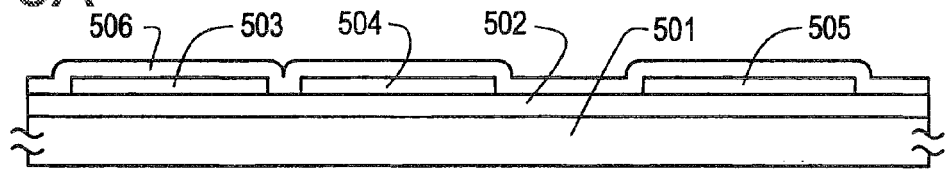
FIGS. 5A to 5G show a process for manufacturing a TFT circuit substrate according to Embodiment 3.

In the present invention, it is desired that a gate insulating film has a sufficiently high withstanding voltage. This is because a high electric field is applied between a gate electrode and a silicon active layer in anodizing process. Therefore, it is preferred that dinitrogen monoxide ($N_2O$) or oxygens ($O_2$) and monosilane ($SiH_4$) is used in a case wherein a gate insulating film is formed by a silicon oxide film obtained by a plasma CVD. (FIG. 5A)

Figure 5B:
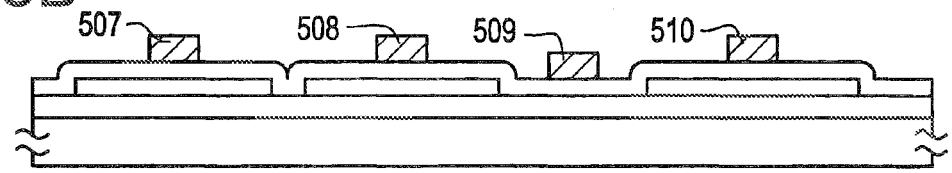

An aluminum film (containing scandium of 0.1 to 0.5 weight %) having a thickness of 2000 Å to 5 μm, preferably 2000 to 6000 Å is formed over a substrate by a sputtering and then etched to form gate electrodes (or gate lines) 507 to 510. The gate line 509 is designed to connect with wirings for anodization (not shown). The gate electrodes 507 and 508 of a peripheral logic circuit are electrically insulated from the wirings for anodization. (FIG. 5B)

A substrate is placed into an electrolytic solution, and then the gate line 509 and the gate electrode 510 are anodized by flowing a current into the wirings for anodization. An anodization condition is described in Japanese Patent Laid Open Number 5-267667. As a result, anodic oxide films 511 and 512 are obtained in upper and side surfaces of the a gate line 509 and the gate electrode 510. A thickness of the anodic oxides depends on a voltage to be applied. In the embodiment, the thickness is 2000 Å.

Figure 5C:
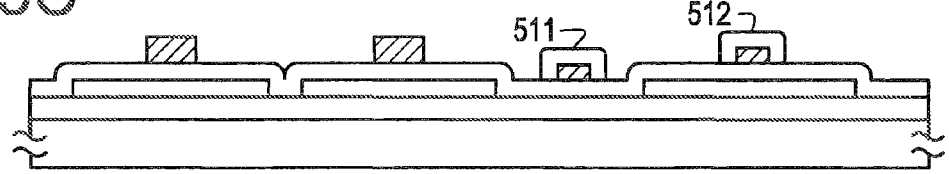

The anodic oxide obtained by anodizing in almost neutral solution is fine and hard and has a high withstanding voltage. The withstanding voltage equal to and higher than 70% of a maximum voltage to be applied in anodization. Such anodic oxide is called a barrier type anodic oxide. (FIG. 5C)

Figure 5D:
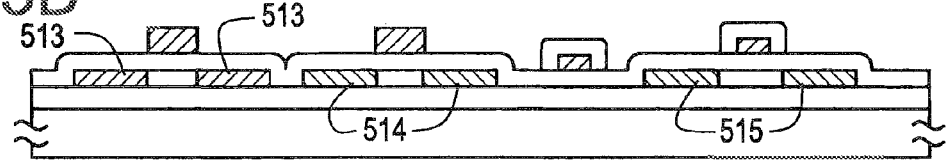

By ion doping, an impurity is introduced into an island-like silicon film of each TFT using a gate electrode portion (gate electrode and anodic oxide film around the gate electrode) as a mask in a self-alignment. In this doping, after phosphorus is introduced into a whole surface using phosphine ($PH_3$) as a doping gas, only the island-like region 503 is covered with a photoresist, and boron is introduced into the island-like regions 504 and 505 using diborane ($B_2H_6$) as a doping gas. The dose is $4 \times 10^{14}$ to $4 \times 10^{15}$ atoms/cm$^2$ in phosphorus and $1 \times 10^{15}$ to $8 \times 10^{15}$ atoms/cm$^2$ in boron. The dose of boron is higher than that of phosphorus. As a result, an N-type region 513 and P-type regions 514 and 515 are formed. (FIG. 5D)

A KrF excimer laser (wavelength of 248 nm and pulse width of 20 ns) is irradiated to improve crystallinity of a portion in which crystallinity deteriorates by impurity introduction to the above impurity regions. An energy density of the laser is 200 to 400 mJ/cm$^2$, preferably 250 to 300 mJ/cm$^2$. As a result, the N-type and P-type regions are activated. A sheet resistance of these regions is 200 to 800 Ω/square. This process may be performed by thermal annealing within a heat resistance range of a gate electrode.

Figure 5E:
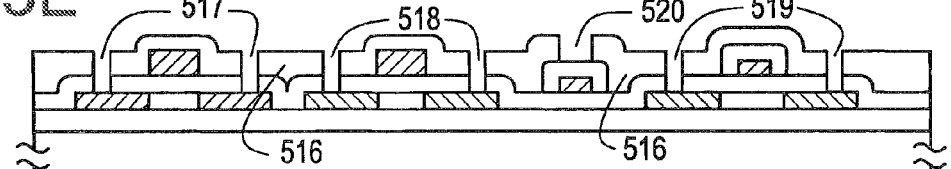

A silicon oxide film having a thickness of 3000 to 6000 Å is formed as an interlayer insulator 516 by a plasma CVD. A multilayer of a silicon nitride film (or a silicon oxide film) and a silicon nitride film may be used as the interlayer insulator 516. The interlayer insulator 516 is etched by a wet etching to form contact holes 517 to 519 in the N-type and P-type regions. Simultaneously, a hole 520 is formed in a gate electrode (gate line). Note that since the anodic oxide film 511 operates as a barrier, etching is stopped, so that the gate line remains unetched. (FIG. 5E)

Figure 5F:
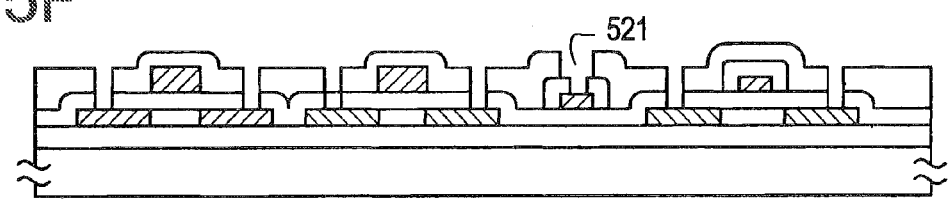

Again, a pattern of a contact hole 520 is formed in the contact hole by a photolithography and then etching is performed using an etchant containing chromic acid, for example, a mixing solution of chromic acid (1 to 5%) and phosphoric acid (or nitric acid, or acetic acid), thereby to form a contact hole 521. (FIG. 5F)

A titanium film having a thickness of 2000 to 6000 Å is formed by a sputtering and then etched to form electrode-wirings 522 to 524 of a peripheral circuit, a data line 525 of an active matrix circuit and an electrode 526 of a pixel TFT. The wiring 523 is connected with the gate line 509.

Figure 5G:
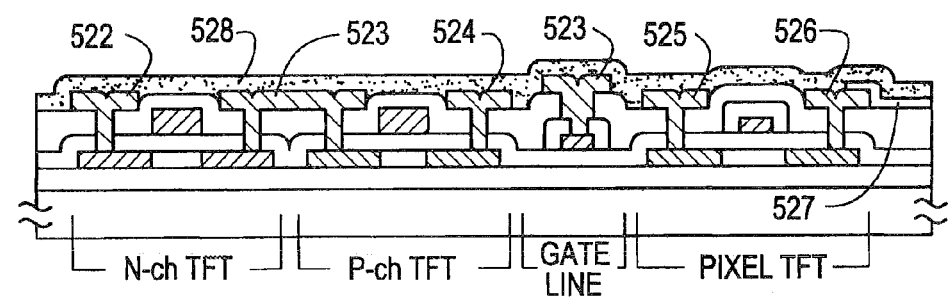

An ITO film having a thickness of 500 to 1500 Å is formed by a sputtering and then etched to form the pixel electrode 527. A silicon nitride film 528 having a thickness of 1000 to 3000 Å is formed as a passivation film. Therefore, peripheral logic circuits and the active matrix circuit are integrated. (FIG. 5G)

A silicon nitride film in a terminal portion (corresponding to the portion 41) connecting with an external IC chip is etched to expose an ITO wiring pad of a terminal connection portion. IC chips are adhered by the FCOG as shown in FIGS. 4A and 4B.

Embodiment 4

This embodiment relates to a method for adhering IC chips to a TFT circuit substrate in which a monolithic type active matrix circuit for a liquid crystal display device is formed by the FCOG, as shown in FIGS. 6A to 6G. In the embodiment, a CMOS circuit is used as a peripheral circuit. Also, only NTFT is shown as a peripheral circuit TFT, and a peripheral logic circuit is shown in a left side and an active matrix circuit is shown in a right side.

A base silicon oxide film 602 having a thickness of 2000 Å is formed on a glass substrate by a plasma CVD. A raw material gas in the plasma CVD is monosilane ($SiH_4$) and dinitrogen monoxide ($N_2O$). A substrate temperature in film formation is 380 to 500° C., for example, 430° C. The formed silicon oxide film 602 has a relative low etching rate and is solid. This is because since dinitrogen monoxide is used as the raw material gas, a silicon oxide/nitride film containing nitrogen of 1 to 10% is obtained. A typical etching rate is 800 to 1100 Å/minute using acetic acid-added buffer hydrofluoric acid (ABHF) (hydrofluoric acid: ammonium fluoride: acetic acid=1:50:50) at 23° C.

An amorphous silicon film having a thickness of 500 Å is formed by a plasma CVD. Thermal annealing is performed for 1 hour at 550° C. in an atmosphere containing oxygen, to form an extremely thin (about 40 to 100 Å by estimate) silicon oxide film on a surface of the amorphous silicon film. By a spin coating, an extremely thin film of nickel acetate is formed using a solution of nickel acetate of 1 to 100 ppm. A thin silicon oxide film is formed first on a surface of the amorphous silicon film, in order to distribute a solution on a surface of the amorphous silicon film.

Thermal annealing is performed for 4 hours at 550° C. in an atmosphere containing nitrogen. The nickel acetate is decomposed at about 400° C., thereby to obtain nickel. Since a thin film of nickel acetate is adhered substantially to the amorphous silicon film, nickel is diffused into the amorphous silicon film by the thermal annealing. Therefore, the amorphous silicon film is crystallized, thereby to form a crystalline silicon region.

A XeCl excimer laser light (wavelength of 308 nm) is irradiated to the silicon film. In the embodiment, an energy density of the laser is 250 to 300 mJ/cm$^2$, thereby to further improve crystallinity of the crystalline silicon film. Further, in order to relax stress-strain by a laser irradiation, thermal annealing is performed again for 4 hours at 550° C.

The silicon film is etched to form island-like active layers 603 and 604. A silicon oxide film 605 having a thickness of 1200 Å is formed as a gate insulating film by a sputtering.

An aluminum (containing scandium of 0.2 to 0.3 weight %) film having a thickness of 4000 Å is formed by a sputtering. By anodizing its surface, an aluminum oxide film (not shown) having a thickness of 100 to 300 Å is formed. Since the aluminum oxide film is present, the aluminum film has high adhesion to a photoresist. Also, by prevent a current leaking from a photoresist, a porous type anodic oxide is effectively formed in sides of a gate electrode or the like in anodization process described below.

Figure 6A:
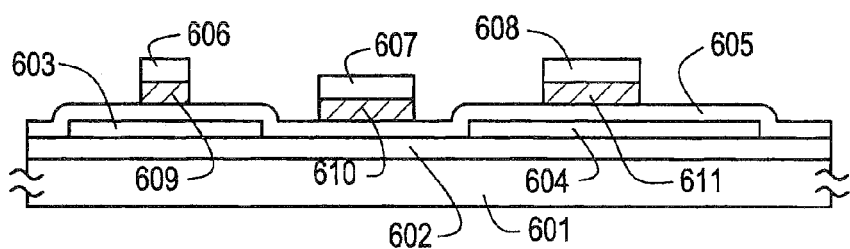
FIGS. 6A to 6G show a process for manufacturing a TFT circuit substrate according to Embodiment 4.

A photoresist (for example a product by Tokyo Ohka Co. Ltd., OFPR800/30 cp) is formed by a spin coating and then is patterned to form gate electrodes 609 and 611 and a gate line 610. The gate electrode 609 and the gate line 610 in a peripheral circuit are electrically insulated from the gate electrode 611 in an active matrix circuit. Photoresists (masks) 606 to 608 used in etching remain. (FIG. 6A)

Figure 6B:
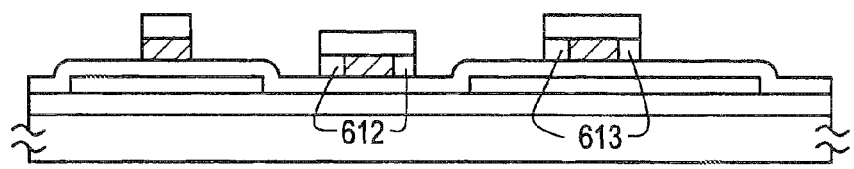

A porous anodization is performed by flowing a current through the gate line 610, i.e., the gate electrode 611 in a state that the photoresists remain, to form porous anodic oxides 612 and 613 in sides of the gate electrode (gate line). An acid solution such as citric acid, oxalic acid, phosphoric acid, chromic acid or sulfuric acid, of 3 to 20%, are used in the anodization. A voltage of 10 to 30 V is applied to the gate electrode. In the embodiment, the anodization is performed for 20 to 80 minutes at 10 V in an oxalic solution (pH=0.9 to 1.0 at 30° C.). A thickness of an anodic oxide is controlled by an anodization period of time. By the anodization using an acid solution, the porous anodic oxide is formed. In the embodiment, a thickness of the porous anodic oxide is 3000 to 10000 Å, for example, 5000 Å. (FIG. 6B)

Figure 6C:
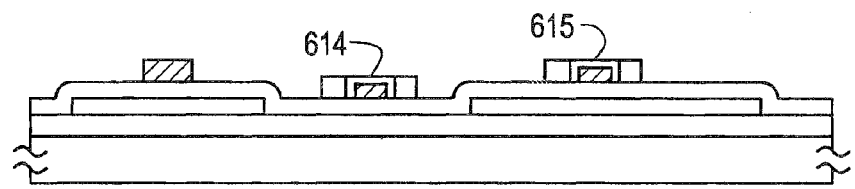

After the photoresists are removed, barrier anodization is performed by flowing a current through the gate line 610, to form fine barrier type anodic oxide films 614 and 615 each having a thickness of 1200 Å in side and upper surfaces of the gate line (gate electrode). (FIG. 6C)

Figure 6D:
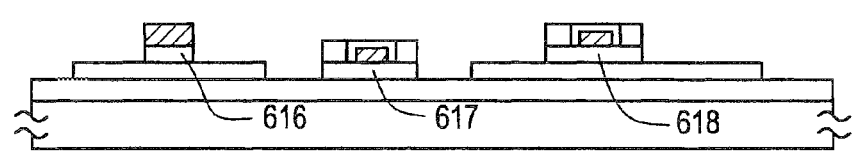

The silicon oxide film 605 is etched using the porous anodic oxides 612 and 613 as masks by a dry etching, to form gate insulating films 617 and 618. This etching may include a plasma mode of isotropic etching or a reactive ion etching mode of anisotropic etching. Note that it is important not to overetch an active layer by increasing sufficiently a selection ratio of silicon and silicon oxide. For example, when $CF_4$ is used as an etching gas, an anodic oxide is not etched and only the silicon oxide film 605 is etched. Also, the silicon oxide films 617 and 618 formed under the porous anodic oxides 612 and 613 remain unetched. (FIG. 6D)

Only the porous anodic oxides are etched using a mixing solution of phosphoric acid, acetic acid and nitric acid. The barrier anodic oxides 614 and 615 are not almost etched by the mixing solution. Since aluminum is etched by the mixing solution, peripheral circuit portions are masked by using photoresists to protect gate electrodes of the peripheral circuit portions. Therefore, a photolithography process is further added in comparison with Embodiment 3.

By ion doping using the gate insulating film, impurities (phosphorus and boron) are introduced into an active layer. Although only NMOS is shown in figures, boron is also doped. In doing of phosphorus, an accelerating voltage is relatively low (10 to 30 KeV) and a dose is relatively high ($5\times10^{14}$ to $5\times10^{15}$ atoms/cm$^2$). Since the accelerating voltage is low, an ion introducing depth is shallow, thereby to introduce the phosphorus into mainly regions 619 and 620 in which a silicon layer is exposed.

Phosphorus is introduced with a relatively low dose of $1\times10^{12}$ to $1\times10^{14}$ atoms/cm$^2$ at a relatively high accelerating voltage of 60 to 95 KeV. Since the accelerating voltage is high, an ion introducing depth is deep, thereby to introduce the phosphorus into a region 621 covered with a gate insulating film. As a result, the regions 619 and 620 into which the phosphorus having a high concentration is doped and the region 621 into which the phosphorus having a low concentration is doped are formed. That is, with respect to a pixel TFT, so called double drain structure can be obtained. In boron, the same process may be performed.

Figure 6E:
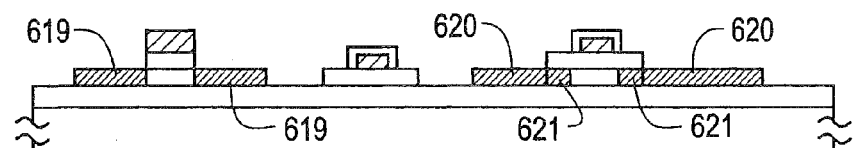

Thermal annealing is performed for 1 hour at 450° C., to activate the doped impurities. In the embodiment, since nickel is used as a promoting element for crystallization, activation can be performed at low temperature than that in normal activation. (FIG. 6E)

Figure 6F:
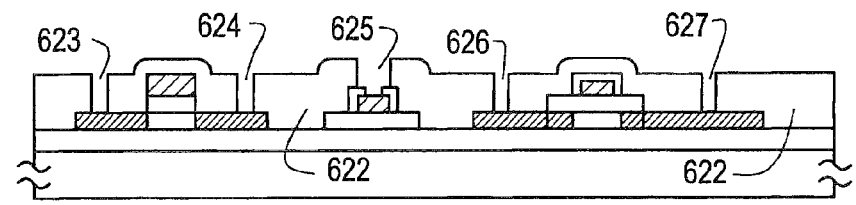

A multilayer film 622 having a silicon oxide film (200 Å in thickness) and a silicon nitride film (4000 Å in thickness) is deposited (formed) as a first interlayer insulator by a plasma CVD, and then etched by a dry etching, to form contact holes 623 to 627. (FIG. 6F)

Figure 6G:
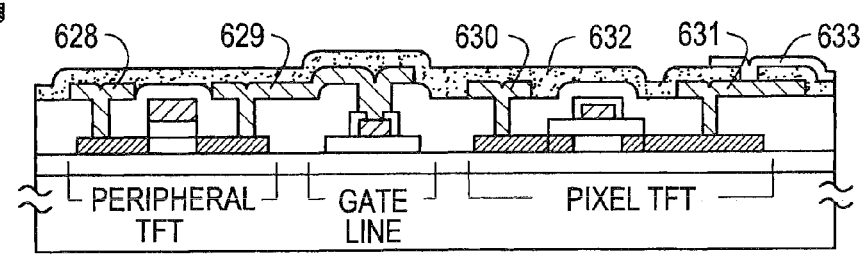

A three layer metal film having titanium (500 Å in thickness), aluminum (4000 Å in thickness) and titanium (500 Å in thickness) is deposited by a sputtering and then etched to form electrode-wirings 628 to 631. Further, by a plasma CVD, a silicon oxide film 632 having a thickness of 2000 Å is deposited as a second interlayer insulator and a contact hole is formed in a drain electrode 631 of a pixel TFT, to form a pixel electrode 633 by an ITO. Therefore, a monolithic type active matrix circuit can be manufactured. (FIG. 6G)

In the above processed substrate, IC chips are mounted on ITO wiring pads of the terminal portion (corresponding to the portion 41) which is connected with external IC chips and adhered by the FCOG as shown in FIGS. 4A and 4B.

Embodiment 5

In the embodiment, chips are adhered to a TFT circuit (monolithic type active matrix circuit) substrate by a wire bonding, to construct further improved circuit. FIGS. 7A to 7D show a process for fabricating an active matrix circuit according to the embodiment of the present invention. In FIGS. 7A to 7D, a left side is a peripheral logic circuit region, and a right side is an active matrix circuit region.

By a sputtering, a base oxide film 701 having a thickness of 2000 Å is deposited on a glass substrate (not shown). Also, an ITO film having a thickness of 500 Å is formed on the base oxide film 701 by a sputtering and then etched to form wirings 702 to 704 of the peripheral logic circuit region and a wiring 705 and a pixel electrode 706 of the active matrix circuit region.

An amorphous silicon film having a thickness of 500 to 1500 Å is deposited by a plasma CVD or a LPCVD with monosilane or disilane as a raw material gas. It is preferred that an oxygen concentration in the amorphous silicon film is $10^{18}$ atoms/cm$^3$ or less.

Phosphine and boron are doped by ion doping similar to that in a known CMOS manufacture. That is, phosphorus is doped, a region forming an N-channel type TFT is masked by photoresists, and then boron is doped into a region forming a P-channel type TFT.

A doping gas for doping phosphorus is phosphine ($PH_3$) and a doping gas for doping boron is dibolane ($B_2H_6$). It is preferred that an accelerating voltage is 5 to 30 kV in phosphorus and boron. A dose is $1\times10^{14}$ to $5\times10^{15}$ atoms/cm$^2$, for example, $2\times10^{14}$ atoms/cm$^2$ in phosphorus and $5\times10^{14}$ atoms/cm$^2$ in boron.

A portion (between a source and a drain) as a channel forming region of each TFT is etched to form N-type semiconductor regions 707, 708, 711 and 712 and P-type semiconductor regions 709 and 710. A substantially intrinsic amorphous silicon hydride film 713 having a thickness of 100 to 500 Å, for example, 200 Å, is formed on these regions by a plasma CVD.

Figure 7A:
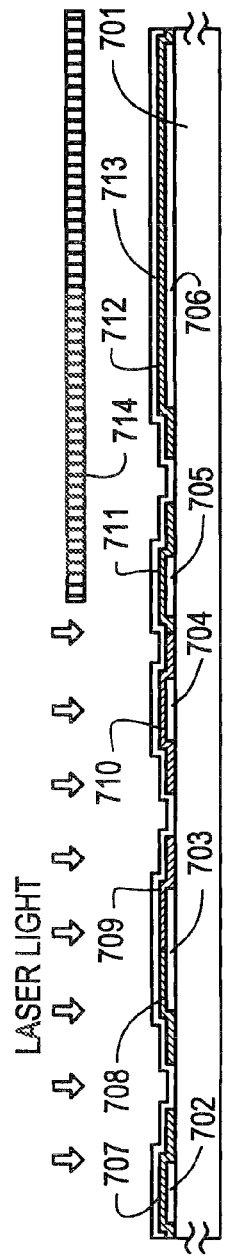
FIGS. 7A to 7D show a process for manufacturing a TFT circuit substrate according to Embodiment 5.

In FIG. 7A, a KrF excimer laser light (wavelength of 248 nm and pulse width of 20 ns) is irradiated using a nonadhesive mask 714 which is not in contact with the film 713, to crystallize the peripheral circuit region (left side) in the film 713. An energy density of the laser is 200 to 400 mJ/cm², preferably 250 to 300 mJ/cm². Since the irradiated laser light does not reach a region (including the active matrix circuit region) covered with the mask 714, the region remains as the amorphous silicon. Also, regions to which the laser is irradiated are crystallized in not only the film 713 but also the regions 707 to 710.

Figure 7B:
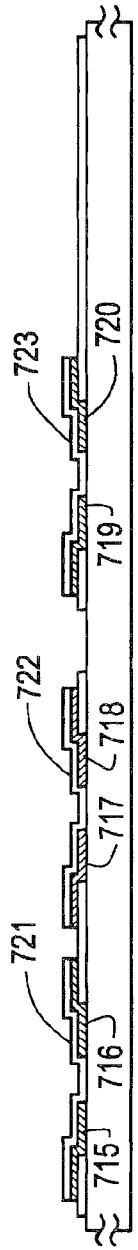

The silicon films (N-type and P-type semiconductor regions and the intrinsic silicon film) are etched at an island shape, to form island-like regions 721 to 723 of a peripheral circuit. Simultaneously, a source 715 and a drain 716 in an N-channel type TFT of a peripheral logic circuit, a source 718 and a drain 717 in a P-channel type TFT of the peripheral logic circuit, and a source 719 and a drain 720 in an N-channel type TFT of an active matrix circuit are also formed. (FIG. 7B)

A silicon oxide film 724 having a thickness of 1200 Å is deposited by a plasma CVD using dinitrogen monoxide ($N_2O$) and oxygens ($O_2$) as raw materials. Since the film 724 operates as a gate insulating film or a dielectric substance of a retaining capacitor, it is necessary for the film to have a sufficiently low interface level density and a high withstanding voltage. In the embodiment, monosilane and dinitrogen monoxide are introduced into a reaction chamber at 10 SCCM and 100 SCCM, respectively. A substrate temperature is 430°, a reaction pressure is 0.3 Torr, and an applied power is 250 W at 13.56 MHz. These conditions depends on a reaction apparatus to be used.

A film forming speed of the silicon oxide film formed in the above conditions is about 1000 Å/minute. When a mixing solution (at 20° C.) of hydrofluoric acid, acetic acid and ammonium fluoride at a rate of 1:50:50, respectively, is used, an etching speed is about 1000 Å/minute. A titanium film having a thickness of 2000 to 8000 Å, for example, 3000 Å is deposited by a sputtering and then etched to form gate electrodes 725 to 727 and a retaining capacitor electrode 728.

Figure 7C:
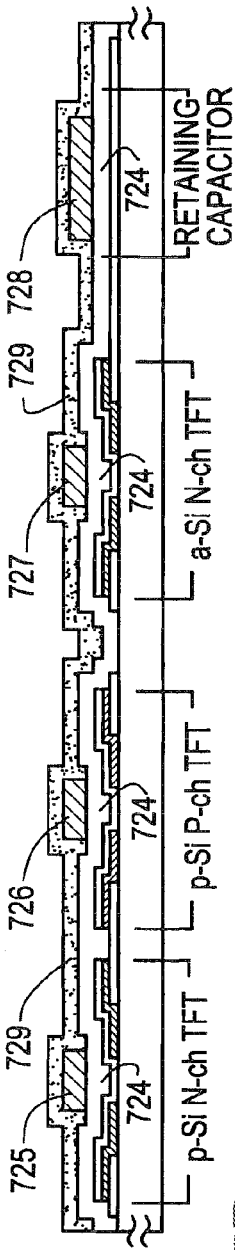

By a plasma CVD, a silicon nitride film 729 having a thickness of 3000 Å is formed as a passivation film. Therefore, N-channel type and P-channel type TFTs (peripheral p-Si N-ch TFT and peripheral p-Si P-ch TFT) of a crystalline silicon of a peripheral logic circuit, an N-channel type amorphous silicon TFT (pixel a-Si N-ch TFT) of an active matrix circuit and a retaining capacitor can be formed. (FIG. 7C)

Figure 7D:
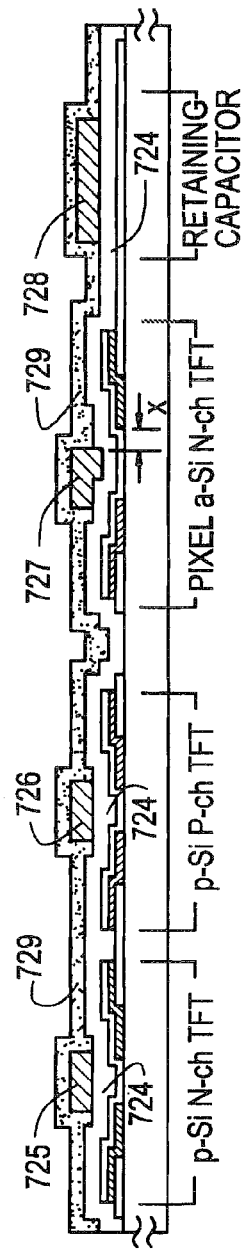

A TFT structure of the peripheral logic circuit may be different from that of the active matrix circuit. For example, an offset structure as shown in FIG. 7D in which the gate electrode of the TFT of the active matrix circuit is formed apart from the drain by a distance x, an off current can be further reduced.

In order to perform the same high speed operation as that of a peripheral logic circuit, it is required that a semiconductor has crystallization, a source and a drain also have crystallization and a sheet resistance is low. In the embodiment, although a laser is irradiated to manufacture a peripheral logic circuit, since not only a channel forming region but also a portion corresponding to a source and a drain are crystallized, the above requirement is satisfied. In order to further improve crystallization of the source and the drain, a catalysis element for promoting crystallization of amorphous silicon, such as nickel, platinum, palladium, cobalt or iron, may be added into a silicon film at a concentration of $1 \times 10^{17}$ to $2 \times 10^{19}$ atoms/cm³.

In the above processed substrate, a silicon nitride film 729 of a terminal portion (corresponding to the portion 21) which is connected with an external IC chip is etched to expose titanium wiring-pads of a terminal connection portion, and connected with the IC chip by a wire bonding as shown in FIG. 2.

Embodiment 6

Figure 8A:
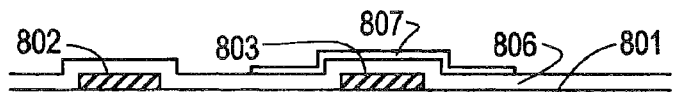
FIGS. 8A to 8I and 9A to 9I show a process for manufacturing a TFT circuit substrate according to Embodiment 6.
Figure 8B:
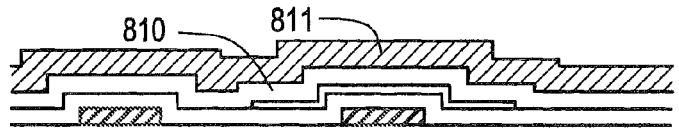
Figure 8C:
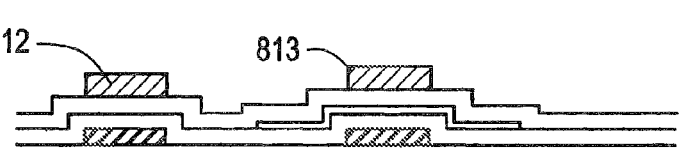
Figure 8D:
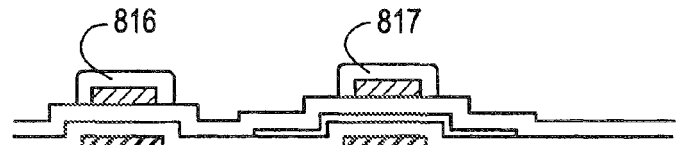
Figure 8E:
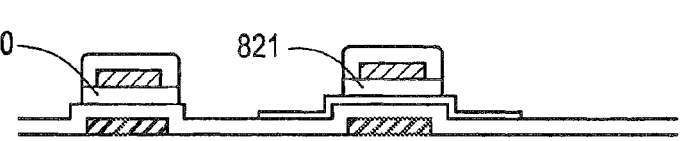
Figure 8F:
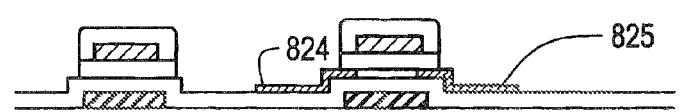
Figure 8G:
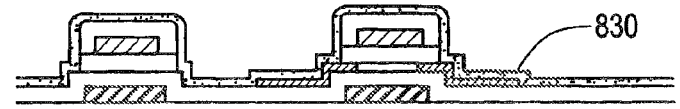
Figure 8H:
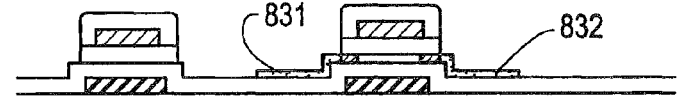
Figure 8I:
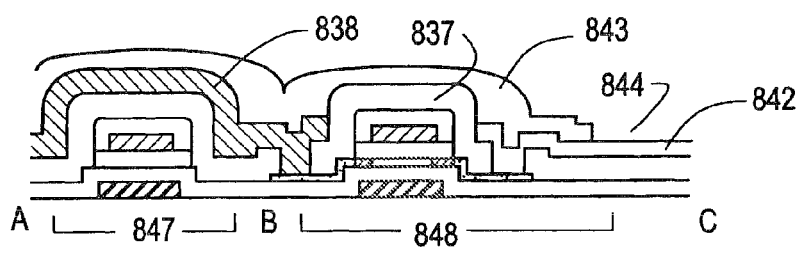
Figure 9A:
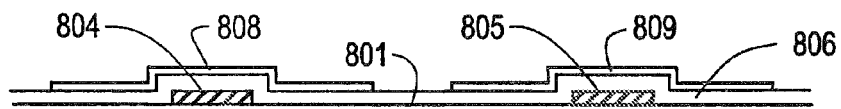
Figure 9B:
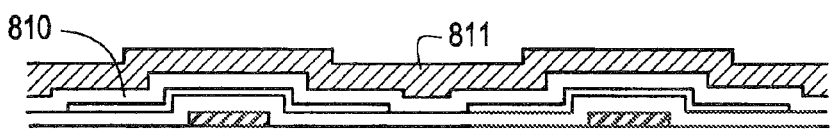
Figure 9C:
Figure 9D:
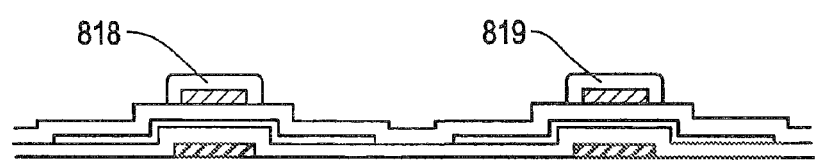
Figure 9E:
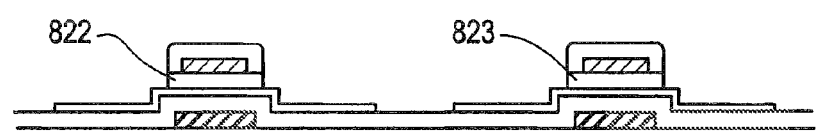
Figure 9F:
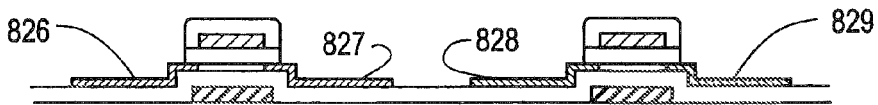
Figure 9G:
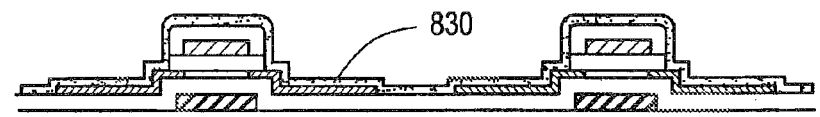
Figure 9H:
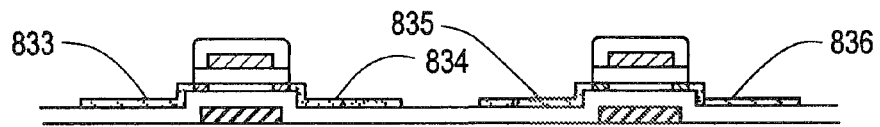
Figure 9I:
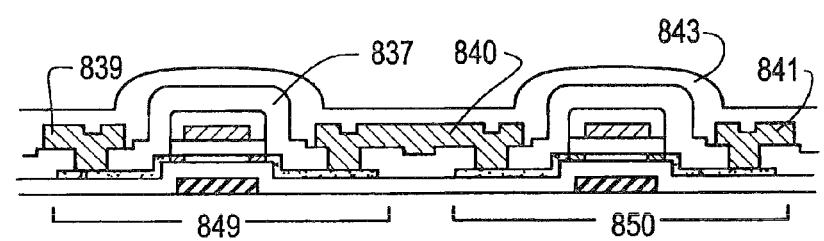
Figure 10A:
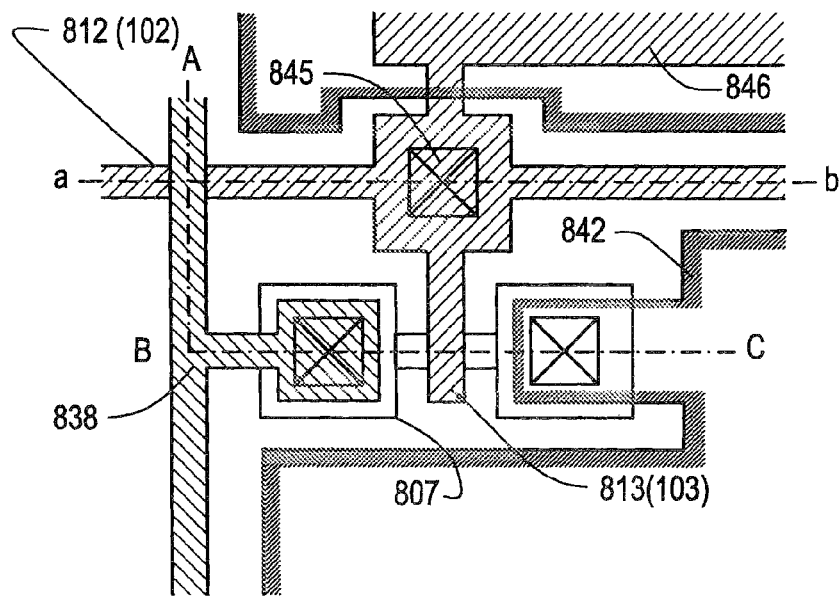
FIGS. 10A to 10C are an upper view, a cross section view and a circuit arrangement view of the TFT circuit according to Embodiment 6, respectively.
Figure 10B:
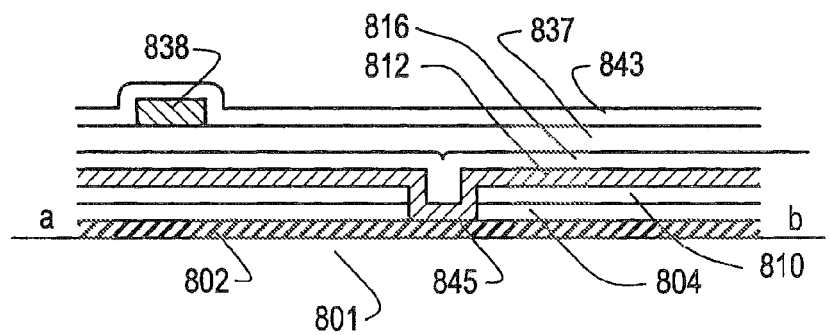
Figure 10C:
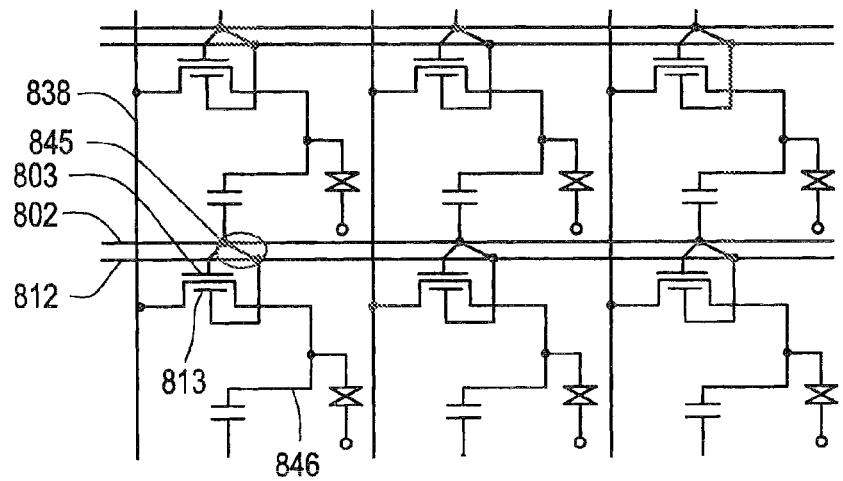

FIGS. 8A to 8I show cross sections of an active matrix circuit portion, and FIGS. 9A to 9I show cross sections of a peripheral circuit portion. Also, FIG. 10A is an upper view of a manufactured active matrix circuit, and FIGS. 8I and 9I represent a cross section of a line A-B-C in FIG. 10A. FIG. 10B represents a cross section of a line a-b in FIG. 10A. FIG. 10C shows a circuit arrangement of a active matrix circuit to be manufactured by the embodiment.

First gate wiring-electrodes 802 to 805 are formed on an insulating surface 801 of a glass substrate on which a silicon nitride film (not shown) having a thickness of 1000 Å is formed. The gate wiring-electrodes are formed by etching a polycrystalline silicon film in which a resistance is reduced by phosphorus doping and has 3000 Å in thickness. The polycrystalline silicon film is formed by a low pressure CVD, and has a polycrystalline state at forming this film.

In order to obtain the polycrystalline silicon film, there is the following method other than the above method. That is, after an intrinsic amorphous silicon film is formed by a plasma CVD or a low pressure CVD, an impurity such as phosphorus is introduced into the silicon film by ion doping or the like. Further, thermal annealing is performed at 500 to 600° C. In the thermal annealing, an element for promoting crystallization, such as nickel may be added slightly. In the embodiment, silicon is used. However, silisides of various metals may be used.

By a plasma CVD, a silicon nitride film 806 having a thickness of 3000 to 6000 Å, for example, 4000 Å, is deposited and operates also as a gate insulating film. Also, an amorphous silicon film having a thickness of 300 to 1000 Å, for example, 500 Å, is formed by a plasma CVD and then etched to form island-like regions 807 to 809. (FIGS. 8A and 9A)

By a plasma CVD, a silicon nitride film 810 having a thickness of 3000 to 6000 Å, for example, 2000 Å is deposited and operates also as a gate insulating film. A laser light is irradiated into only a peripheral circuit portion to crystallize the island-like silicon film. The laser is a XeCl excimer laser (wavelength of 308 nm). An irradiation energy density of the laser and the number of pulse are changed in accordance with film characteristics of the silicon film and the silicon nitride film 810.

The silicon nitride films 806 and 810 are etched to from a contact hole (not shown) which reaches the first gate wiring. This contact hole is used to form a contact between the first gate wiring and a second gate wiring which is formed on the first gate wiring and corresponds to a contact 845 as shown in FIGS. 10A and 10B.

After forming the contact hole, an aluminum film 811 having a thickness of 3000 to 8000 Å, for example, 5000 Å, is formed by a sputtering. When the aluminum film 811 contains scandium (Sc) of 0.1 to 0.5 weight %, generation of hillock can be prevented. (FIGS. 8B and 9B)

The aluminum film 811 is etched to form second gate wiring-electrodes 812 to 815. As a result, a contact of the first gate wiring and the second gate wiring is formed through the formed contact hole. It is necessary to completely cover the contact hole with the second gate wiring. This is because when the first gate wiring constructed by silicon is exposed in a contact hole, a current flows through an exposed portion in an anodizing process, thereby not to progress an anodizing reaction. (FIGS. 8C and 9C)

In an electrolytic solution, a current is supplied to a gate electrode. An ethylene glycol solution which is obtained by adding ammonia to tartaric acid of 3 to 10% and has 6.8 to 7.2 pH is used. When the solution has about 10° C. lower than a room temperature, an oxide film having high quality is formed. Therefore, barrier anodic oxides 816 to 819 are formed in an upper and side surface of the second gate wiring-electrodes. A thickness of the anodic oxide is proportional to an applied voltage and is preferably 1000 to 3000 Å. The anodic oxide having a thickness of 2000 Å is formed at 150 V. In order to obtain an anodic oxide having a thickness of 3000 Å or more, it is necessary to apply 250 V or higher. However, this influences a TFT characteristic. (FIGS. 8D and 9D)

By dry etching, the silicon nitride film 810 is etched in self-alignment. However, since the anodic oxides are not etched, gate insulating films 820 to 823 remain between gate wiring-electrodes and an island-like silicon layer. (FIGS. 8E and 9E)

By ion doping, N-type and P-type impurities are introduced into the island-like silicon layers 807 to 809 using gate electrode portions (gate electrode and anodic oxide film around the gate electrode) in self-alignment, to fault an N-type impurity regions (source/drain regions) 824 to 827 and a P-type impurity regions 828 and 829. A doping gas in an N-type impurity doping is phosphine ($PH_3$) and a doping gas in a P-type impurity doping is diborane ($B_2H_6$). A dose is $5\times10^{14}$ to $5\times10^{15}$ atoms/cm$^2$, and an accelerating energy is 10 to 30 key. A KrF excimer laser (wavelength of 248 nm and pulse width of 20 ns) is irradiated to activate impurity ions introduced into an active layer. (FIGS. 8F and 9F)

A metal such as a titanium film 830 having a thickness of 50 to 500 Å, is formed on a whole surface by a sputtering method. (FIGS. 8G and 9G)

By thermal annealing at 450 to 500° C., for example, 500° C. for 10 to 60 minutes, titanium reacts with silicon, to form siliside (titanium silicide) regions 831 to 836. In this thermal annealing, the doped impurities are further activated. In stead of thermal annealing for siliside process, laser annealing by a laser light irradiation, and lamp annealing by visible light irradiation or near infrared light irradiation may be performed.

A titanium film is etched using an etching solution obtained by mixing among hydrogen peroxide, ammonia and water at a ratio of 5:2:2, respectively. since a titanium film (for example, a titanium film which is formed on the silicon nitride film 806 and the anodic oxide film) which is not in contact with the exposed active layer remains in a metal state, it can be etched in this etching process. On the other hand, the titanium silicide is not etched and therefore remains (FIGS. 8H and 9H)

By a CVD, a silicon oxide film having a thickness of 5000 Å is formed as a first interlayer insulator 837 on a whole surface. Contact holes are formed in a source and a drain in a TFT. After forming the first interlayer insulator, annealing is performed at 400° C. for 10 to 30 minutes. Aluminum wiring-electrodes 838 to 841 are formed and a pixel electrode 842 is formed using an ITO film.

In order not to enter water component, an active ion or the like into a TFT form an external, a silicon nitride film 843 having a thickness of 2000 to 5000 Å, for example, 3000 Å is formed by a plasma CVD, and a pixel portion 844 and a terminal portion (not shown) connecting a peripheral circuit with an external IC chip is opened to expose the ITO film. (FIGS. 8I and 9I)

By the above processes, a wiring intersection portion 847 in an active matrix circuit, a TFT 848 connected to a pixel, and an N-channel type TFT 849 and a P-channel type TFT 850 in a peripheral circuit is formed to obtain a monolithic type active matrix circuit.

FIG. 10A is an upper views of a TFT provided with a pixel portion. It is appeared that a gate line extended from a scan driver is a single line in FIG. 10A. However, the first gate line 802 is formed in parallel under the second gate line 812. The first and second gate lines are connected with each other through the contact 845. In an active matrix circuit according to the embodiment, one contact is formed for one TFT.

Although one of the first and second gate lines is broken, the whole line does not become inferior. In the embodiment, as shown in FIG. 10A, a contact is formed in a branch portion in which the gate lines are branched. This is because, in providing a pad region (wiring region having thick width) for forming a contact, it is not necessary for the branch portion to provide a special space and therefore it is superior in layout.

FIG. 10B shows a cross section structure in a line a-b along a gate line as shown in FIG. 10A. FIG. 10C shows an active matrix circuit having a plurality of circuits each shown in FIG. 10A. In FIG. 10A, the gate line 812 (and 802) is also branched to a wiring 846 extended under an upper line pixel electrode. A capacitor is formed between the wiring 846 and a pixel electrode and arranged in parallel to a capacitor of a liquid crystal formed by a pixel electrode on a circuit. In the processed substrate, an IC chip is mounted on a terminal portion (corresponding to a portion 41) of an ITO for connecting with an external IC chip and adhered to the IC chip by the FCOG method as shown in FIGS. 4A and 4B.

Embodiment 7

In the embodiment, an IC chip is connected with a monolithic type active matrix circuit (TFT circuit) substrate which an active matrix circuit using amorphous silicon (a-Si) TFTs and a peripheral circuit using crystalline silicon TFTs are formed on the same glass substrate.

FIGS. 11A to 11E show a process for manufacturing a monolithic type active matrix circuit of the embodiment. A silicon oxide film having a thickness of 1000 to 3000 Å is formed as a base oxide film 902 on a glass substrate 901. By a plasma CVD or a LPCVD, a silicon film 903 having amorphous is deposited at a thickness of 300 to 1500 Å, for example, 500 Å. Further, a silicon oxide film (or a silicon nitride film) having a thickness of 50 to 1000 Å, for example, 200 Å is formed as a protective film 904 by a plasma CVD.

Figure 11A:
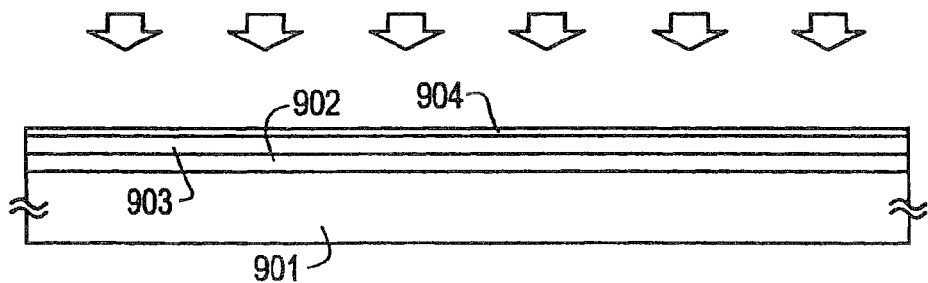
FIGS. 11A to 11E show a process for manufacturing a TFT circuit substrate according to Embodiment 7.

A KrF excimer laser (wavelength of 248 nm and pulse width of 20 ns) is irradiated to improve crystallinity of the silicon film 903. An energy density of the laser is 200 to 400 mJ/cm$^2$, preferably 250 to 300 mJ/cm$^2$. (FIG. 11A)

The protective film 904 is removed to expose the silicon film 903 and patterned in an island shape to form an N-channel type TFT region 905 and a P-channel type TFT region 906. Further, a gate insulating film 907 is formed by a sputtering in an atmosphere containing oxygen or by decomposing and depositing a TEOS using a plasma CVD.

Figure 11B:
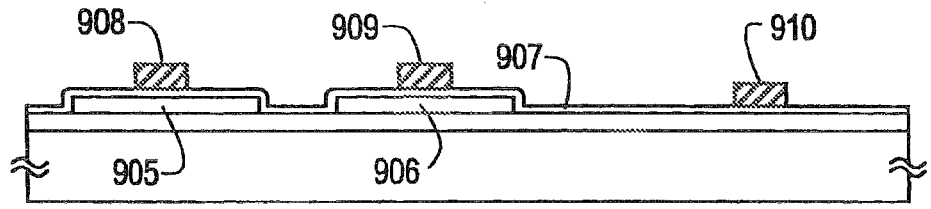

An aluminum film having a thickness of 2000 Å to 5 μm is formed by a sputtering and then etched to form gate electrodes 908 and 909. Simultaneously, a gate electrode 910 of a reversed stagger type TFT of an active matrix portion is also formed. (FIG. 11B)

Figure 11C:
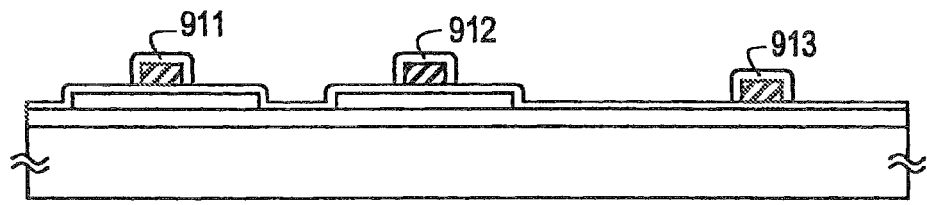

The substrate is immersed in an electrolytic solution to supply a current to a gate electrode, thereby to form anodic oxide layers 911 to 913 around the gate electrode. It is desired that anodic oxide films of a TFT (left side) of a peripheral circuit region is thin to improve mobility of the TFT and anodic oxide films of a TFT (reverse stagger type TFT in right side) of an active matrix circuit is thick to prevent a gate leakage. In the embodiment, Both anodic oxide films have 2000 to 2500 Å in thickness. (FIG. 11C)

By ion doping, an impurity is introduced into an island-like silicon film of each TFT using a gate electrode portion (gate electrode and anodic oxide film around the gate electrode) as a mask in self-alignment. That is, phosphorus is introduced first into a whole surface using phosphine ($PH_3$) as a doping gas. After that only the island-like region 905 is masked by a photoresist, and then boron is introduced into only the island-like region 906. A dose is $2 \times 10^{15}$ to $8 \times 10^{15}$ atoms/cm$^2$ in phosphorus and $4 \times 10^{15}$ to $10 \times 10^{15}$ atoms/cm$^2$ in boron. The dose of boron is higher than that of phosphorus.

Figure 11D:
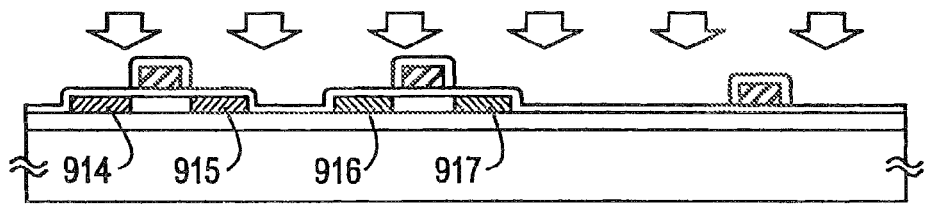
Figure 11E:
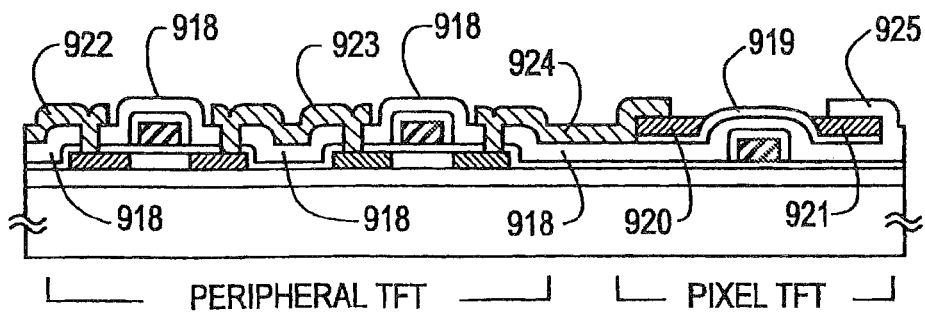

A KrF excimer laser (wavelength of 248 nm and pulse width of 20 ns) is irradiated to improve crystallinity of a portion in which crystallinity deteriorates by introduction of the impurity. An energy density of the laser is 200 to 400 mJ/cm$^2$, preferably 250 to 300 mJ/cm$^2$. (FIG. 11D)

As a result, N-type regions 914 and 915 and P-type regions 916 and 917 are formed. A sheet resistance of these regions is 200 to 800 Ω/square.

By a plasma CVD, a silicon nitride film having a thickness of 3000 Å is formed as an interlayer insulator 918 on a whole surface. The silicon nitride film is an interlayer insulator in a peripheral circuit. However, since the silicon nitride film operates as an gate electrode of a TFT in an active matrix circuit, it is necessary to pay attention to its film manufacture.

An amorphous silicon layer 919 having a thickness of 100 to 500 Å, for example, 200 Å, is formed on the gate electrode 910 of an active matrix portion, and then a source 920 and a drain 921 of an amorphous silicon TFT is formed using a microcrystalline silicon layer (500 to 1000 Å in thickness) formed by a plasma CVD. A pixel electrode 925 is formed using a transparent conductive material such as an ITO in a TFT of an active matrix portion.

Contact holes are formed in a source and a drain of each TFT of a peripheral circuit portion, to form aluminum wirings 922 to 924. An invertor circuit is manufactured using an N-channel type TFT and a P-channel type TFT in left side. Annealing is performed for 2 hours at 350° C. in an atmosphere containing hydrogen, to decrease dangling bonds of a silicon film. By the above processes, a peripheral circuit and an active matrix circuit are integrated.

In the embodiment, a reversed stagger type TFT is used as an amorphous silicon TFT of an active matrix circuit, so as not to irradiate light into a channel portion. This is because conductivity of an amorphous silicon changes by light irradiation. In the processed substrate, an IC chip is connected with a terminal portion (corresponding to the portion 21) of an aluminum wiring connecting with an external IC chip by using the wire bonding method as shown in FIG. 2.

What is claimed is:

1. A display device comprising:
   a thin film transistor in a pixel portion, the thin film transistor comprising:
   a conductive layer over a substrate;
   an insulating film over the conductive layer;
   a semiconductor layer including a channel region over the conductive layer with the insulating film therebetween;
   a gate insulating film over the semiconductor layer;
   a gate electrode over the gate insulating film; and
   a pixel electrode electrically connected to the semiconductor layer,
   wherein the gate electrode is overlapped with the conductive layer,
   wherein the gate electrode is electrically connected to the conductive layer through a contact hole formed in the insulating film and the gate insulating film, and
   wherein the contact hole is formed between neighboring source wirings.

2. The display device according to claim 1, further comprising a silicon nitride film covering the thin film transistor,
   wherein a portion of the pixel electrode is not overlapped with the silicon nitride film.

3. The display device according to claim 1, wherein the semiconductor layer is a silicon film.

4. The display device according to claim 2, wherein a portion of the silicon nitride film is over the pixel electrode.

5. The display device according to claim 1, wherein the substrate is a glass substrate.

6. The display device according to claim 1, wherein the conductive layer comprises silicon or metal silicide.

7. The display device according to claim 2, wherein the silicon nitride film has a thickness of 2000 to 5000 Å.

8. A display device comprising:
   a thin film transistor in a pixel portion, the thin film transistor comprising:
   a conductive layer over a substrate;
   an insulating film over the conductive layer;
   a semiconductor layer including a channel region over the conductive layer with the insulating film therebetween;
   a gate insulating film over the semiconductor layer;
   a gate electrode over the gate insulating film,
   a pixel electrode electrically connected to the semiconductor layer; and
   a wiring intersection portion, the wiring intersection portion comprising:
   a first wiring over the substrate;
   a gate wiring over the first wiring with the insulating film and the gate insulating film interposed therebetween; and
   a second wiring over the gate wiring, the second wiring being electrically connected to the semiconductor layer,
   wherein the gate electrode is overlapped with the conductive layer,
   wherein the gate electrode is electrically connected to the conductive layer through a contact hole formed in the insulating film and the gate insulating film, and
   wherein the contact hole is formed between neighboring source wirings.

9. The display device according to claim 8, further comprising a silicon nitride film covering the thin film transistor and the wiring intersection portion,
   wherein a portion of the pixel electrode is not overlapped with the silicon nitride film.

10. The display device according to claim 8, wherein the semiconductor layer is a silicon film.

11. The display device according to claim 9, wherein a portion of the silicon nitride film is over the pixel electrode.

12. The display device according to claim 8, wherein the substrate is a glass substrate.

13. The display device according to claim 8, wherein the conductive layer comprises silicon or metal silicide.

14. The display device according to claim 9, wherein the silicon nitride film has a thickness of 2000 to 5000 Å.

15. The display device according to claim 8, wherein the first wiring is electrically connected with the gate wiring.

16. A display device comprising:
a first thin film transistor in a pixel portion, the first thin film transistor comprising:
a first conductive layer over a substrate;
a first insulating film over the first conductive layer;
a first semiconductor layer including a first channel region over the first conductive layer with the first insulating film therebetween;
a first gate insulating film over the first semiconductor layer;
a first gate electrode over the first gate insulating film; and
a pixel electrode electrically connected to the first semiconductor layer,
a second thin film transistor in a peripheral circuit, the second thin film transistor comprising:
a second conductive layer over the substrate;
a second insulating film over the second conductive layer;
a second semiconductor layer including a second channel region over the second conductive layer with the second insulating film therebetween; and
a second gate electrode over the second semiconductor layer,
wherein the first gate electrode is overlapped with the first conductive layer,
wherein the first gate electrode is electrically connected to the first conductive layer through a contact hole formed in the first insulating film and the first gate insulating film,
wherein the contact hole is formed between neighboring source wirings,
wherein the second gate electrode is overlapped with the second conductive layer, and
wherein the second gate electrode is electrically connected to the second conductive layer.

17. The display device according to claim 16, further comprising a silicon nitride film covering the first thin film transistor and the second thin film transistor,
wherein a portion of the pixel electrode is not overlapped with the silicon nitride film.

18. The display device according to claim 16, wherein each of the first semiconductor layer and the second semiconductor layer is a silicon film.

19. The display device according to claim 17, wherein a portion of the silicon nitride film is over the pixel electrode.

20. The display device according to claim 16, wherein the substrate is a glass substrate.

21. The display device according to claim 16, wherein the first conductive layer includes silicon or metal silicide.

22. The display device according to claim 17, wherein the silicon nitride film has a thickness of 2000 to 5000 Å.

23. A display device comprising:
a first thin film transistor in a pixel portion, the first thin film transistor comprising:
a first conductive layer over a substrate;
a first insulating film over the first conductive layer;
a first semiconductor layer including a first channel region over the first conductive layer with the first insulating film therebetween;
a first gate insulating film over the first semiconductor layer;
a first gate electrode over the first gate insulating film;
a pixel electrode electrically connected to the first semiconductor layer;
a second thin film transistor in a peripheral circuit, the second thin film transistor comprising:
a second conductive layer over the substrate;
a second insulating film over the second conductive layer;
a second semiconductor layer including a second channel region over the second conductive layer with the second insulating film therebetween; and
a second gate electrode over the second semiconductor layer,
a wiring intersection portion, the wiring intersection portion comprising:
a first wiring over the substrate;
a gate wiring over the first wiring with the first insulating film and the first gate insulating film interposed therebetween; and
a second wiring over the gate wiring, the second wiring being electrically connected to the second semiconductor layer,
wherein the first gate electrode is overlapped with the first conductive layer,
wherein the first gate electrode is electrically connected to the first conductive layer through a contact hole formed in the first insulating film and the first gate insulating film,
wherein the contact hole is formed between neighboring source wirings,
wherein the second gate electrode is overlapped with the second conductive layer, and
wherein the second gate electrode is electrically connected to the second conductive layer.

24. The display device according to claim 23, further comprising a silicon nitride film covering the first thin film transistor, the second thin film transistor, and the wiring intersection portion,
wherein a portion of the pixel electrode is not overlapped with the silicon nitride film.

25. The display device according to claim 23, wherein each of the first semiconductor layer and the second semiconductor layer is a silicon film.

26. The display device according to claim 24, wherein a portion of the silicon nitride film is over the pixel electrode.

27. The display device according to claim 23, wherein the substrate is a glass substrate.

28. The display device according to claim 23, wherein the first conductive layer includes silicon or metal silicide.

29. The display device according to claim 24, wherein the silicon nitride film has a thickness of 2000 to 5000 Å.

30. The display device according to claim 23, wherein the first wiring is electrically connected with the gate wiring.

31. The display device according to claim 1, wherein the contact hole is not overlapped with the neighboring source wirings.

32. The display device according to claim 8, wherein the contact hole is not overlapped with the neighboring source wirings.

33. The display device according to claim 16, wherein the contact hole is not overlapped with the neighboring source wirings.

34. The display device according to claim 23, wherein the contact hole is not overlapped with the neighboring source wirings.

* * * * *